(12) United States Patent
Yamazaki et al.

(10) Patent No.: US 7,566,640 B2
(45) Date of Patent: Jul. 28, 2009

(54) METHOD FOR MANUFACTURING THIN FILM INTEGRATED CIRCUIT DEVICE, NONCONTACT THIN FILM INTEGRATED CIRCUIT DEVICE AND METHOD FOR MANUFACTURING THE SAME, AND IDTAG AND COIN INCLUDING THE NONCONTACT THIN FILM INTEGRATED CIRCUIT DEVICE

(75) Inventors: Shunpei Yamazaki, Setagaya (JP); Miho Komori, Isehara (JP); Yurika Satou, Hiratsuka (JP); Kazue Hosoki, Atsugi (JP); Kaori Ogita, Machida (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 175 days.

(21) Appl. No.: 10/581,674

(22) PCT Filed: Dec. 14, 2004

(86) PCT No.: PCT/JP2004/018978

§ 371 (c)(1),
(2), (4) Date: Jun. 5, 2006

(87) PCT Pub. No.: WO2005/057658

PCT Pub. Date: Jun. 23, 2005

(65) Prior Publication Data

US 2007/0166954 A1   Jul. 19, 2007

(30) Foreign Application Priority Data

Dec. 15, 2003   (JP)   ............................. 2003-417317

(51) Int. Cl.
*H01L 21/00* (2006.01)
(52) U.S. Cl. ............................. 438/464; 257/E21.237

(58) Field of Classification Search .................. 438/113, 438/460, 462, 464
See application file for complete search history.

(56) References Cited

U.S. PATENT DOCUMENTS 5,206,749 A   4/1993   Zavracky et al.

(Continued)

FOREIGN PATENT DOCUMENTS

EP   0 443 263   8/1991

(Continued)

OTHER PUBLICATIONS

Leading Trends, *"Sense of Crisis" is a Trigger. Ignited Evolution of a Sesame-Grain Sized Chip Technology Development is Entering into the Second Phase*, Nikkei Electronics, Nov. 18, 2002, pp. 67-76.

(Continued)

*Primary Examiner*—W. David Coleman
(74) *Attorney, Agent, or Firm*—Eric J. Robinson; Robinson Intellectual Property Law Office, P.C.

(57) ABSTRACT

To provide a thin film integrated circuit which is mass produced at low cost, a method for manufacturing a thin film integrated circuit according to the invention includes the steps of: forming a peel-off layer over a substrate; forming a base film over the peel-off layer; forming a plurality of thin film integrated circuits over the base film; forming a groove at the boundary between the plurality of thin film integrated circuits; and introducing a gas or a liquid containing halogen fluoride into the groove, thereby removing the peel-off layer; thus, the plurality of thin film integrated circuits are separated from each other.

20 Claims, 21 Drawing Sheets

U.S. PATENT DOCUMENTS

| | | | |
|---|---|---|---|
| 5,317,236 A | 5/1994 | Zavracky et al. | |
| 5,376,561 A | 12/1994 | Vu et al. | |
| 5,378,536 A | 1/1995 | Miller et al. | |
| 5,389,438 A | 2/1995 | Miller et al. | |
| 5,541,399 A * | 7/1996 | de Vall | 235/491 |
| 5,757,456 A | 5/1998 | Yamazaki et al. | |
| 5,821,138 A | 10/1998 | Yamazaki et al. | |
| 5,834,327 A | 11/1998 | Yamazaki et al. | |
| 5,888,858 A | 3/1999 | Yamazaki et al. | |
| 5,985,740 A | 11/1999 | Yamazaki et al. | |
| 6,043,800 A | 3/2000 | Spitzer et al. | |
| 6,063,654 A | 5/2000 | Ohtani | |
| 6,100,562 A | 8/2000 | Yamazaki et al. | |
| 6,118,502 A | 9/2000 | Yamazaki et al. | |
| 6,127,199 A | 10/2000 | Inoue et al. | |
| 6,133,835 A | 10/2000 | De Leeuw et al. | |
| 6,165,824 A | 12/2000 | Takano et al. | |
| 6,168,829 B1 | 1/2001 | Russ et al. | |
| 6,180,439 B1 | 1/2001 | Yamazaki et al. | |
| 6,348,368 B1 | 2/2002 | Yamazaki et al. | |
| 6,376,333 B1 | 4/2002 | Yamazaki et al. | |
| 6,465,287 B1 | 10/2002 | Yamazaki et al. | |
| 6,479,333 B1 | 11/2002 | Takano et al. | |
| 6,509,217 B1 | 1/2003 | Reddy | |
| 6,521,511 B1 | 2/2003 | Inoue et al. | |
| 6,621,099 B2 | 9/2003 | Ong et al. | |
| 6,627,518 B1 | 9/2003 | Inoue et al. | |
| 6,700,631 B1 | 3/2004 | Inoue et al. | |
| 6,770,904 B2 | 8/2004 | Ong et al. | |
| 6,777,529 B2 | 8/2004 | Ong et al. | |
| 6,781,152 B2 | 8/2004 | Yamazaki | |
| 6,814,832 B2 | 11/2004 | Utsunomiya | |
| 6,821,348 B2 | 11/2004 | Baude et al. | |
| 6,821,553 B2 | 11/2004 | Miyashita et al. | |
| 6,825,072 B2 | 11/2004 | Yamazaki et al. | |
| 6,858,518 B2 | 2/2005 | Kondo | |
| 6,887,650 B2 | 5/2005 | Shimoda et al. | |
| 6,893,503 B1 | 5/2005 | Ohnuma et al. | |
| 6,911,358 B2 | 6/2005 | Azami et al. | |
| 7,045,438 B2 | 5/2006 | Yamazaki et al. | |
| 7,056,381 B1 | 6/2006 | Yamazaki et al. | |
| 7,060,153 B2 | 6/2006 | Yamazaki et al. | |
| 7,067,843 B2 | 6/2006 | Carcia et al. | |
| 7,088,145 B2 | 8/2006 | Baude et al. | |
| 7,091,070 B2 | 8/2006 | Imai et al. | |
| 7,122,445 B2 | 10/2006 | Takayama et al. | |
| 7,129,145 B2 | 10/2006 | Kawamura et al. | |
| 7,159,241 B1 * | 1/2007 | Horiguchi et al. | 726/10 |
| 7,166,500 B2 | 1/2007 | Yamazaki et al. | |
| 7,202,495 B2 | 4/2007 | Unno | |
| 7,244,662 B2 | 7/2007 | Kondo | |
| 7,271,076 B2 * | 9/2007 | Yamazaki et al. | 438/458 |
| 2001/0015256 A1 | 8/2001 | Yamazaki et al. | |
| 2001/0053559 A1 | 12/2001 | Nagao et al. | |
| 2002/0094639 A1 | 7/2002 | Reddy | |
| 2003/0006121 A1 * | 1/2003 | Lee et al. | 194/206 |
| 2003/0022403 A1 | 1/2003 | Shimoda et al. | |
| 2003/0032210 A1 | 2/2003 | Takayama et al. | |
| 2004/0016115 A1 * | 1/2004 | Hashimoto | 29/842 |
| 2004/0026520 A1 * | 2/2004 | Kawai et al. | 235/492 |
| 2004/0087110 A1 | 5/2004 | Takayama et al. | |
| 2004/0256618 A1 | 12/2004 | Imai et al. | |
| 2005/0037529 A1 | 2/2005 | Nagao et al. | |
| 2005/0042798 A1 | 2/2005 | Nagao et al. | |
| 2005/0051872 A1 | 3/2005 | Kawamura et al. | |
| 2005/0106839 A1 | 5/2005 | Shimoda et al. | |
| 2005/0116048 A1 * | 6/2005 | Sauter et al. | 235/492 |
| 2005/0148121 A1 | 7/2005 | Yamazaki et al. | |
| 2005/0287846 A1 | 12/2005 | Dozen et al. | |
| 2007/0063057 A1 * | 3/2007 | Masubuchi et al. | 235/492 |
| 2007/0161159 A1 | 7/2007 | Yamazaki et al. | |
| 2008/0009125 A1 | 1/2008 | Yamazaki et al. | |

FOREIGN PATENT DOCUMENTS

| | | |
|---|---|---|
| EP | 0 607 709 | 7/1994 |
| EP | 0607709 | 7/1994 |
| EP | 1 193 759 | 4/2002 |
| EP | 1455302 | 9/2004 |
| EP | 1455394 | 9/2004 |
| JP | 06-299127 | 10/1994 |
| JP | 07-030209 | 1/1995 |
| JP | 08-096959 | 4/1996 |
| JP | 09-063770 | 3/1997 |
| JP | 2992092 | 12/1999 |
| JP | 2001-030403 | 2/2001 |
| JP | 2001-260580 | 9/2001 |
| JP | 2001-272923 | 10/2001 |
| JP | 2001-284342 | 10/2001 |
| JP | 2002-343877 | 11/2002 |
| JP | 2003-203898 | 7/2003 |
| JP | 2003-209073 | 7/2003 |
| WO | WO 00/51181 | 8/2000 |
| WO | WO 03/010825 | 2/2003 |
| WO | WO-2005/057658 | 6/2005 |

OTHER PUBLICATIONS

International Search Report for PCT/JP2004/018978 dated Mar. 15, 2005.
Written Opinion for PCT/JP2004/018978 dated Mar. 15, 2005.
International Search Report dated Mar. 22, 2005 for Application No. PCT/JP2005/001541.
Written Opinion of the International Searching Authority dated Mar. 22, 2005 for Application No. PCT/JP2005/001541.
Shimoda. T et al., "Surface Free Technology by Laser Annealing (SUFTLA),", IEDM 99: Technical Digest of International Electron Devices Meeting, 1999, pp. 289-292.

* cited by examiner

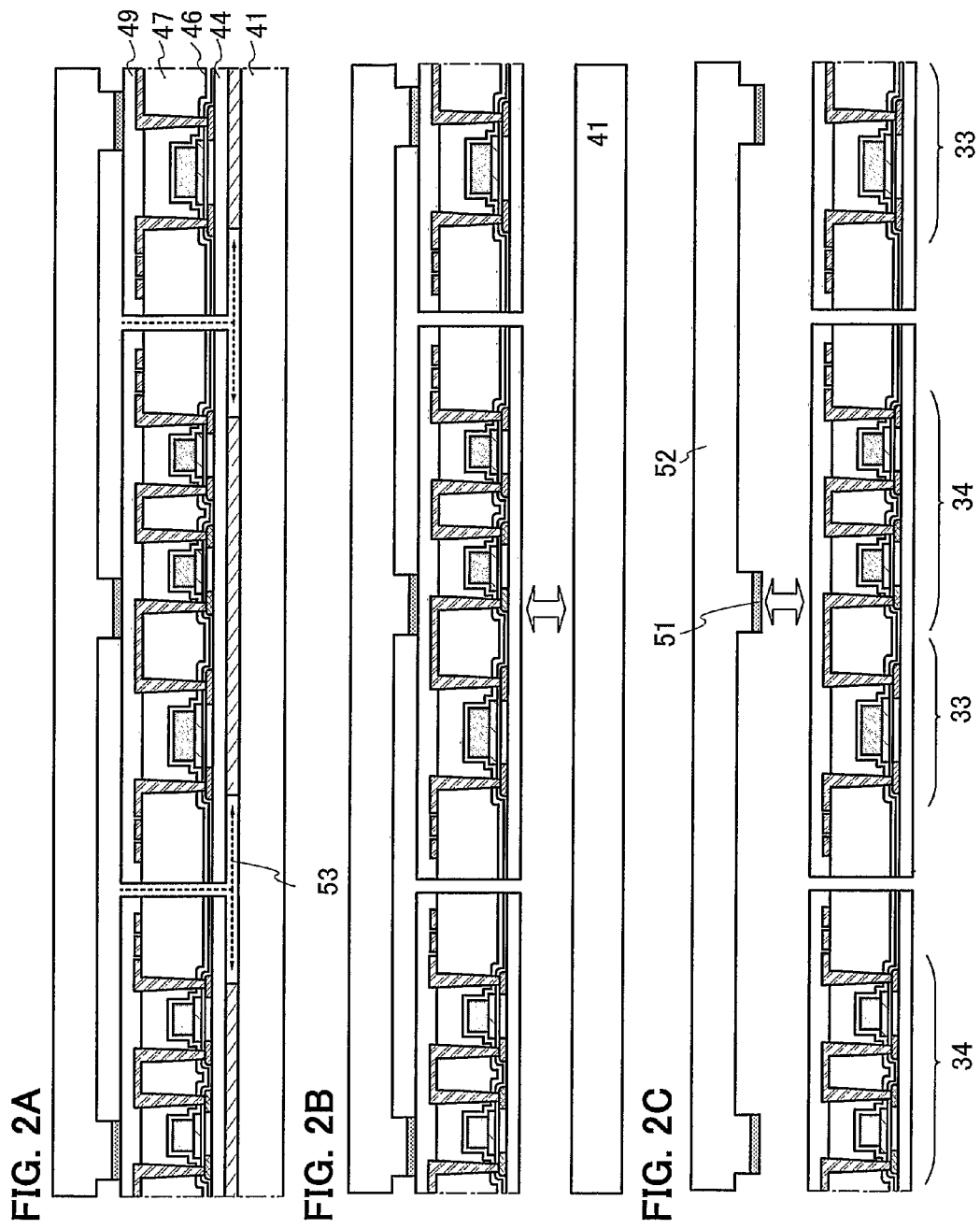

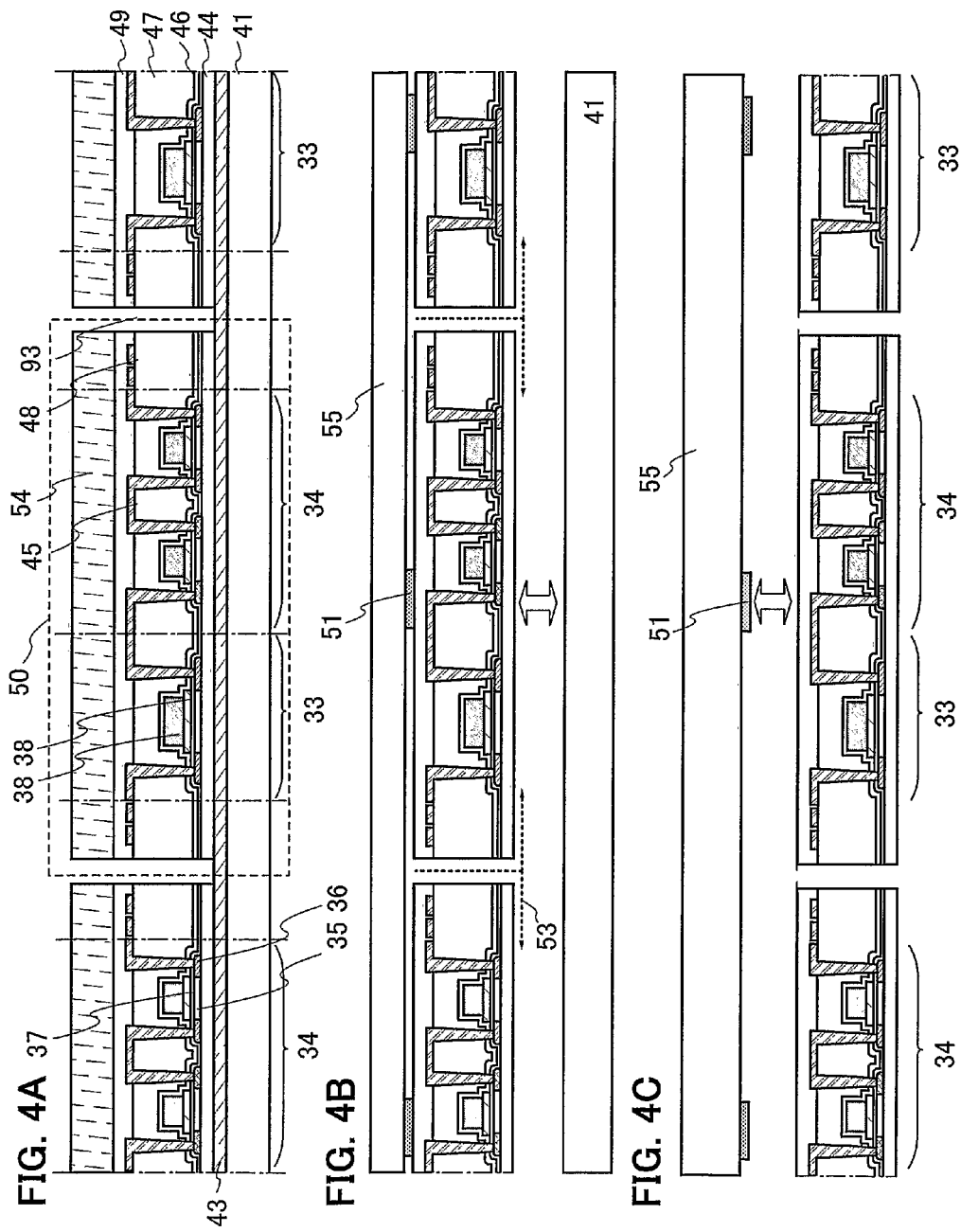

21

METHOD FOR MANUFACTURING THIN FILM INTEGRATED CIRCUIT DEVICE, NONCONTACT THIN FILM INTEGRATED CIRCUIT DEVICE AND METHOD FOR MANUFACTURING THE SAME, AND IDTAG AND COIN INCLUDING THE NONCONTACT THIN FILM INTEGRATED CIRCUIT DEVICE

TECHNICAL FIELD

The present invention relates to a method for manufacturing a thin film integrated circuit device including a thin film integrated circuit that has an element such as a memory and a microprocessor (CPU: Central Processing Unit) and is thin and flexible like paper, and to a noncontact thin film integrated circuit device including the thin film integrated circuit and an antenna, which is used mainly for a card, a tag, a label, or the like for identifying human beings, animals and plants, commercial products, banknotes, and the like.

BACKGROUND ART

Recently, in all kinds of industrial worlds such as food industry and manufacturing industry, enhancement of safety and management systems of commercial products has been required, and therewith, the amount of information on the commercial products are increasing. However, the current information given to a commercial product is limited to information such as a country of manufacture, a manufacturer, or an item number, mainly provided by ten and several digits of a bar code, and the amount of information is quite small. Further, in the case of using bar codes, it takes time to manually read the bar codes one by one. Correspondingly, instead of the bar code system, an automatic identification technology by using a noncontact IC tag utilizing an electromagnetic wave, referred to as RFID (Radio Frequency Identification), has been attracting attention.

In addition, in order to ensure safety of animals and plants (for example, a place of origin, whether infected with an infectious disease or not, or the like), a system is becoming common, in which IC chips are directly implanted into bodies of the animals and plants to obtain and manage information on the animals and plants by an information reading device (reader) provided outside the bodies.

In addition, the number of cards owned by a person has been growing, and above all, a noncontact IC card which establishes communication by utilizing electromagnetic field is becoming common, for example, in forms of electronic money and electronic tickets. Further, as cases such as heinous crimes and disappearances are increased, an ID (identification) card or the like is becoming common, with which whereabouts of an individual particularly such as an infant, a pupil, an elderly person, or a tourist can be exactly grasped constantly so that the individual can be recognized and protected from getting involved in an accident.

Furthermore, in order to prevent duplication or abuse of banknotes, coins, securities, tickets, or the like which are forged or stolen, a technique of implanting IC chips into them is becoming common (Reference 1: Nikkei Electronics (Nikkei Business Publications, Inc.) published on Nov. 18, 2002, pp. 67-76).

DISCLOSURE OF INVENTION

As noncontact type and contact type IC chips become common, it is necessary to mass-produce IC chips, which are used for human beings, animals, plants, commercial products, banknotes, and the like, at extremely low cost. For example, it is necessary to manufacture IC chips to be applied to commercial products, banknotes, and the like at a cost of 1 to several yen per IC chip, preferably, at a cost less than one yen, and it is desired to realize a structure and a manufacturing process of an IC chip that can be mass-produced at low cost.

In order to manufacture an IC chip, a method has been used, in which a plurality of thin film integrated circuits are formed on a silicon wafer, and the thin film integrated circuits are separated by polishing and removing the silicon wafer (referred to as back-grinding). Since the silicon wafer is all polished and removed in spite of its expensive price, the increase in manufacturing cost is unavoidable. Further, since an integrated circuit using a silicon wafer is thick, irregularities are produced on a surface; thus, design is limited in the case of mounting onto a product container.

Alternatively, as a method in which a substrate is not polished or removed, there is a method in which a substrate on which a plurality of thin film integrated circuits are formed is stressed to separate the substrate physically. However, this method has a possibility that the substrate is not completely separated due to a factor such as stress distribution of a thin film formed on the substrate.

In view of the above, it is an object of the present invention to provide a structure of a thin film integrated circuit and an IC chip, which can be mass-produced at low cost and has a quite thin thickness unlike the conventional silicon wafer, and to provide a manufacturing process of the thin film integrated circuit device or the IC chip.

1) A method for manufacturing a thin film integrated circuit device according to the present invention includes the steps of forming a peel-off layer over a substrate, forming a plurality of thin film integrated circuits over the peel-off layer with a base film interposed therebetween, forming a groove at a boundary between the plurality of thin film integrated circuits; and separating the plurality of thin film integrated circuits by filling the groove with one of a gas and a liquid containing halogen fluoride to remove the peel-off layer.

The peel-off layer is a layer provided between the substrate and the thin film integrated circuits, and the thin film integrated circuits can be separated from the substrate by removing the peel-off layer later. For the peel-off layer, a layer containing silicon (Si) as its main component, such as amorphous silicon, polycrystalline silicon, single-crystal silicon, semi-amorphous silicon (SAS) (also referred to as microcrystalline silicon), can be used. Since silicon is selectively etched by halogen fluoride such as $ClF_3$ (chlorine trifluoride) or the like, the peel-off layer can be easily removed by the gas or liquid containing $ClF_3$ when the layer containing silicon as its main component is used as the peel-off layer.

The base film is provided between the peel-off layer and the thin film integrated circuits, and has a function of protecting the thin film integrated circuits from being etched by halogen fluoride such as $ClF_3$. Here, silicon oxide (SiOx), silicon nitride (SiNx), silicon oxide containing nitrogen (SiOxNy(x>y)), or silicon nitride containing oxygen (SiNxOy(x>y)) is hardly etched by halogen fluoride such as $ClF_3$ while silicon is selectively etched. Accordingly, since the base film containing silicon oxide, silicon nitride, silicon oxide containing nitrogen (SiOxNy(x>y)), or silicon nitride containing oxygen (SiNxOy(x>y)) is hardly etched while the peel-off layer is etched with time, the thin film integrated circuits can be prevented from being damaged.

As long as a material that is etched by halogen fluoride such as $ClF_3$ is used for the peel-off layer and a material that is not etched by halogen fluoride is used for the base film, the combination of the peel-off layer and the base film is not limited to the above-mentioned materials, and the materials can be appropriately selected.

As a gas for etching, a gas of the $ClF_3$ or the like mixed with nitrogen may be used. $ClF_3$ (boiling point: 11.75° C.) can be liquid depending on the temperature of a reaction field, and wet etching can also be employed in such a case. $ClF_3$ can be produced through a process of $Cl_2$ (g)+$3F_2$ (g)→$2ClF_3$ (g) by reacting chlorine with fluorine at a temperature of 200° C. or more. As long as the above-mentioned peel-off layer is etched and the above-mentioned base film is not etched, the etchant is not limited to $ClF_3$ or halogen fluoride.

The groove at the boundaries between the thin film integrated circuits can be formed by a method such as dicing, scribing, or etching using a mask. In the case of dicing, a blade dicing method using a dicing system (dicer) is commonly used. A blade is a grinding stone into which diamond abrasive grains are implanted, which has a width of about 30 μm to 50 μm. By rapidly spinning the blade, the thin film integrated circuits are separated from each other. In the case of scribing, diamond scribing, laser scribing, or the like is used. In the case of etching, after forming a mask pattern by exposure and development, the circuits can be separated from each other by etching such as dry etching or wet etching. In dry etching, an atmospheric plasma treatment may be used.

As the substrate, a substrate formed from an insulating material such as glass, quartz, or alumina; a silicon wafer substrate; a plastic substrate which is resistant to the processing temperature of the post process; or the like can be used. In this case, a base insulating film containing silicon oxide (SiOx), silicon nitride (SiNx), silicon oxide containing nitrogen (SiOxNy(x>y)), silicon nitride containing oxygen (SiNxOy(x>y)), or the like, may be formed to prevent impurities from diffusing through the substrate. Further, a substrate of metal such as stainless steel, or semiconductor whose surface is coated with an insulating film of silicon oxide, silicon nitride, or the like may be used.

Further, a substrate which has been separated in forming the thin film integrated circuit may be reused. In the case of reusing, it is desirable to prevent the substrate from being damaged by the dicing or the scribing process. However, if the substrate is damaged, the substrate may be planarized by applying an organic or inorganic resin thereover by coating or a droplet discharge method (ink-jet or the like).

It is desired to previously form a protective film over the thin film integrated circuit by CVD or the like, so that the thin film integrated circuit is protected from etching using halogen fluoride or the like. A heat-resistant organic resin or heat-resistant inorganic resin is preferably used particularly in the case of heating halogen fluoride for carrying out etching. A material that has a skeletal structure including a bond of silicon (Si) and oxygen (O) and includes at least hydrogen as a substituent or at least one selected from the group consisting of fluorine, an alkyl group, and aromatic hydrocarbon as the substituent, that is a siloxane based resin or the like, is typically used as the heat-resistant organic resin. Hereinafter, the heat-resistant organic resin shall include a siloxane based resin.

2) A method for manufacturing a thin film integrated circuit according to the present invention includes the steps of forming a peel-off layer over a substrate, forming a plurality of thin film integrated circuits over the peel-off layer with a base film interposed therebetween, forming a groove at a boundary between the plurality of thin film integrated circuits, attaching a jig to the upper portion of the plurality of thin film integrated circuits, and separating the plurality of thin film integrated circuits by introducing one of a gas and a liquid containing halogen fluoride in the groove to remove the peel-off layer The jig denotes a supporting substrate for temporarily fixing the plurality of thin film integrated circuit devices in order to prevent thin film integrated circuit devices from separating discretely after removing the peel-off layer. The jig is formed for each of the elements in which a plurality of the thin film integrated circuit devices are accumulated in the horizontal or vertical direction. It is preferable that the jig has a comb-like structure with projections so that later the gas or liquid containing halogen fluoride is easily applied. However, a flat jig may also be used. As the jig, for example, a glass substrate or a quartz substrate, containing silicon oxide which is not damaged by halogen fluoride as its main component, or a stainless (SUS) substrate can be used. The jig is not limited to the substrates above as long as the material is not damaged by halogen fluoride. In addition, an adhesive material for temporary bonding the jig and the thin film integrated circuit device is provided therebetween.

As the adhesive material, a material that has adhesive force (tack strength) to be reduced or lost by UV light irradiation can be used. Alternatively, an adhesive material that can be attached and detached repeatedly, which is used for products such as "Post-it" (Japanese registered trademark) manufactured by THREE M INNOVATIVE PROPERTIES and "NOTESTIX" (Japanese registered trademark) manufactured by MOORE BUSINESS FORMS INC., may be used. As long as the jig can be easily removed, the adhesive material is not limited thereto.

The description of the above 1) according to the invention may be referred to as other structures.

3) A method for manufacturing a noncontact thin film integrated circuit device according to the present invention includes the steps of forming a peel-off layer on a substrate, forming a plurality of thin film integrated circuits over the peel-off layer with a base film interposed therebetween, forming a heat-resistant organic resin over the plurality of thin film integrated circuits, forming a groove at a boundary between the plurality of thin film integrated circuits, separating the plurality of thin film integrated circuit devices by introducing a gas or a liquid including halogen fluoride into the groove to remove the peel-off layer, forming an antenna above or below the separated thin film integrated circuits.

The thin film integrated circuit device here has a function of identifying human beings, animals, plants, commercial products, banknotes, and the like or storing information on them. Further, a thin film integrated circuit device here includes an ID chip (Identification Chip), an IDF (ID Flexible) chip, an IC chip, and the like. Above all, the thin film integrated circuit device for establishing communication with an external reading/writing device (reader/writer) through a transmitting and receiving portion (an antenna and an antenna circuit) incorporated in the thin film integrated circuit utilizing electromagnetic field is referred to as a noncontact thin film integrated circuit device or a radio-frequency chip. Communication between the thin film integrated circuit device and the reader/writer makes it possible to recognize, update, or manage, information on a commercial product or the like including the thin film integrated circuit device.

The antenna here is for establishing communication, that is, radio wave exchanges, using a reader/writer, and is connected to an integrated circuit such as a thin film integrated circuit. The antenna may be formed before or after a step of forming a TFT or the like in a thin film integrated circuit, or in the step. Alternatively, the antenna may be formed separately and thereafter connected to the thin film integrated circuit. For example, the antenna can be formed with forming a gate electrode of a TFT. As the antenna, there are a coiled (spiral) antenna shown in FIGS. 7A to 7C and a closed loop coil antenna shown in FIGS. 11A to 11C, and the like.

In the case of separately forming the antenna, the antenna may be formed so that a part or whole of the thin film integrated circuit is wrapped with a substrate on which the antenna is formed. In this case, an anisotropic conductive material or a known bonding method may be used to connect the antenna with the thin film integrated circuit.

In forming the thin film integrated circuits formed of TFTs or the like, which are incorporated in the thin film integrated circuit device, it is preferable to provide a jig for temporarily fixing the thin film integrated circuit devices in order to prevent the thin film integrated circuit devices from separating discretely after removing the peel-off layer. The jig may be formed according to the method 2) described above. In addition, other components of the noncontact thin film integrated circuit device may be formed according to any of the methods 1) to 2) described above.

4) A noncontact thin film integrated circuit device according to the invention includes a thin film integrated circuit formed over the substrate with a base film interposed therebetween, a heat-resistant insulating film formed over the thin film integrated circuit, and an antenna formed on the upper or lower portion of the thin film integrated circuit.

As a material for the heat-resistant film, a heat-resistant organic resin that has a skeletal structure including a bond of silicon (Si) and oxygen (O) and includes at least hydrogen as a substituent or at least one selected from the group consisting of fluorine, an alkyl group, and aromatic hydrocarbon as the substituent, that is a siloxane based resin or the like, or a heat-resistant inorganic resin can be used.

The antenna here is for establishing communication, that is, radio wave exchanges, using a reader/writer, and is connected to an integrated circuit such as a thin film integrated circuit. As a material to be used for the antenna, an element selected from the group consisting of Ag, Au, Al, Cu, Zn, Sn, Ni, Cr, Fe, Co, and Ti, and an alloy including the elements can be used. However, the material is not limited thereto. In the case of separately forming the antenna, the antenna may be formed so that a part or whole of the thin film integrated circuit is wrapped with a substrate on which the antenna is formed. In this case, it is preferable to use a flexible material such as plastics for the substrate.

The noncontact thin film integrated circuit device according to the invention can be incorporated into, for example, ID tags, ID cards, various commercial products, banknotes, and coins. In the case of incorporating the thin film integrated circuit device into a coin, one of components of the coin may also serve as an antenna. In this case, as a material for forming the antenna or the coin, an element selected from the group consisting of Ag, Au, Al, Cu, Zn, Sn, Ni, Cr, Fe, Co, and Ti, and an alloy including the elements can be used. However, the material is not limited thereto.

The substrate or the base film may have structures according to 1) to 3) described above.

Conventionally, a method has been used in which a plurality of thin film integrated circuits are formed on a silicon wafer, and the thin film integrated circuits are separated by polishing and removing the silicon wafer. Meanwhile, according to the invention, a chemical process using a halogen fluoride is used for separating the plurality of thin film integrated circuits from the substrate where the thin film integrated circuits has been formed. Therefore, a glass substrate which is less expensive than a silicon wafer can be used. Thus, thin film integrated circuits used for a thin film integrated circuit device or the like can be manufactured at low cost. Further, even in the case of using a quartz substrate which is as expensive as a silicon wafer, according to the invention, the substrate can be reused, thus, thin film integrated circuits used for a thin film integrated circuit device or the like can be manufactured at low cost.

Further, back-grinding that cause a crack or grinding marks is not required to be carried out unlike an IC formed of a silicon wafer. The nonuniformity of the film thickness of the thin film integrated circuits depends on the nonuniformity that is generated in forming each film of the integrated circuit. Therefore, the nonuniformity of the film thickness of the thin film integrated circuits can be reduced to at most about several hundred nanometers which is considerably less than the nonuniformity of several to several tens of μm that is generated during wafer back-grinding.

Further, in the invention, a plurality of thin film integrated circuits are separated from the substrate provided with the thin film integrated circuits by a chemical process using a halogen fluoride; thus, the thin film integrated circuits can be separated without fault as compared with the physical process in which the substrate provided with the plurality of thin film integrated circuits is stressed so that the substrate is separated physically.

Further, in the case of forming a base film or a heat-resistant insulating film (protective film) so as to cover the thin film integrated circuits, the thin film integrated circuits can be protected while the substrate is separated with the use of halogen fluoride. Thus, thin film integrated circuits having stable characteristics can be formed.

Further, each thin film integrated circuit device is temporarily bonded to a jig during the step of separating the substrate with the use of halogen fluoride; thus, the thin film integrated circuit devices can be prevented from separating discretely after removing the peel-off layer. In this case, when a material having adhesive force (tack strength) that is reduced or lost by UV light irradiation is used as a temporary adhesive material, the jig can be removed easily from the thin film integrated circuit devices after separating the substrate.

As described above, according to the present invention, a thin film integrated circuit used for a thin film integrated circuit device, and further a thin film integrated circuit device and commercial products using the thin film integrated circuit device can be mass-produced at low cost with higher yield and throughput.

BRIEF DESCRIPTION OF DRAWINGS

FIGS. 2A to 2C show manufacturing steps of a thin film integrated circuit device according to the present invention.

FIGS. 4A to 4C show manufacturing steps of a thin film integrated circuit device according to the invention.

BEST MODE FOR CARRYING OUT THE INVENTION

Figure 1A:
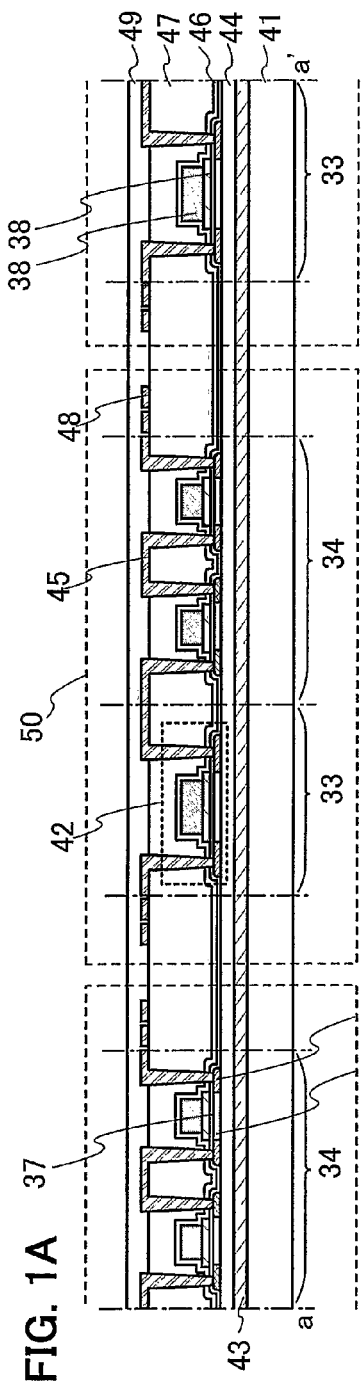
FIGS. 1A to 1C show manufacturing steps of a thin film integrated circuit device according to the present invention.

Embodiments of the invention will be described in detail with reference to drawings. It is easily understood by those skilled in the art that the invention is not limited to the following descriptions, and various changes may be made in forms and details without departing from the spirit and the scope of the invention. Therefore, the invention should not be limited to the descriptions of embodiments and embodiment modes below. The same reference numerals are commonly given to the same components through the drawings, and the detailed description will not be repeated.

Embodiment Mode 1

A thin film integrated circuit device and a method for manufacturing the thin film integrated circuit according to the present invention will be described with reference to FIGS. 1A and 1C, FIGS. 2A to 2C, FIGS. 3A and 3B, and FIG. 12. First, a peel-off layer 43 is formed over a substrate 41. Here, an a-Si film (amorphous silicon film) is formed to a film thickness of 500 nm by sputtering. As the substrate, a substrate formed from an insulating material such as glass or alumina; a silicon wafer substrate; a plastic substrate which is resistant to the processing temperature of the post process; or the like can be used instead of a quartz substrate. In this case, a base insulating film containing silicon oxide (SiOx), silicon nitride (SiNx), silicon oxide containing nitrogen (SiOxNy (x>y)), silicon nitride containing oxygen (SiNxOy(x>y)), or the like, may be formed to prevent impurities from diffusing from the substrate. Further, a substrate of metal such as stainless steel, or semiconductor whose surface is coated with an insulating film of silicon oxide, silicon nitride, or the like may be used.

As the peel-off layer 43, a layer containing silicon as its main component, such as polycrystalline silicon, single-crystal silicon, or semiamorphous silicon (SAS, microcrystalline silicon) can be used instead of amorphous silicon. The peel-off layer 43 may be formed by plasma CVD instead of sputtering. The peel-off layer 43 may be formed to a thickness less than 500 nm.

Next, a base film 44 is formed over the peel-off layer 43. Here, a silicon oxide film is formed to a film thickness of 100 nm by sputtering. The base film 44 has a function of protecting a thin film integrated circuit from etching using halogen fluoride such as $ClF_3$. Therefore, another material may be used as long as the material has this function. For example, a material such as silicon nitride, silicon oxide containing nitrogen, or silicon nitride containing oxygen can be used. Alternatively, films respectively including the above-mentioned materials may be laminated to form the base film 44. The base film 44 may be formed by plasma CVD or the like instead of sputtering.

Figure 18:
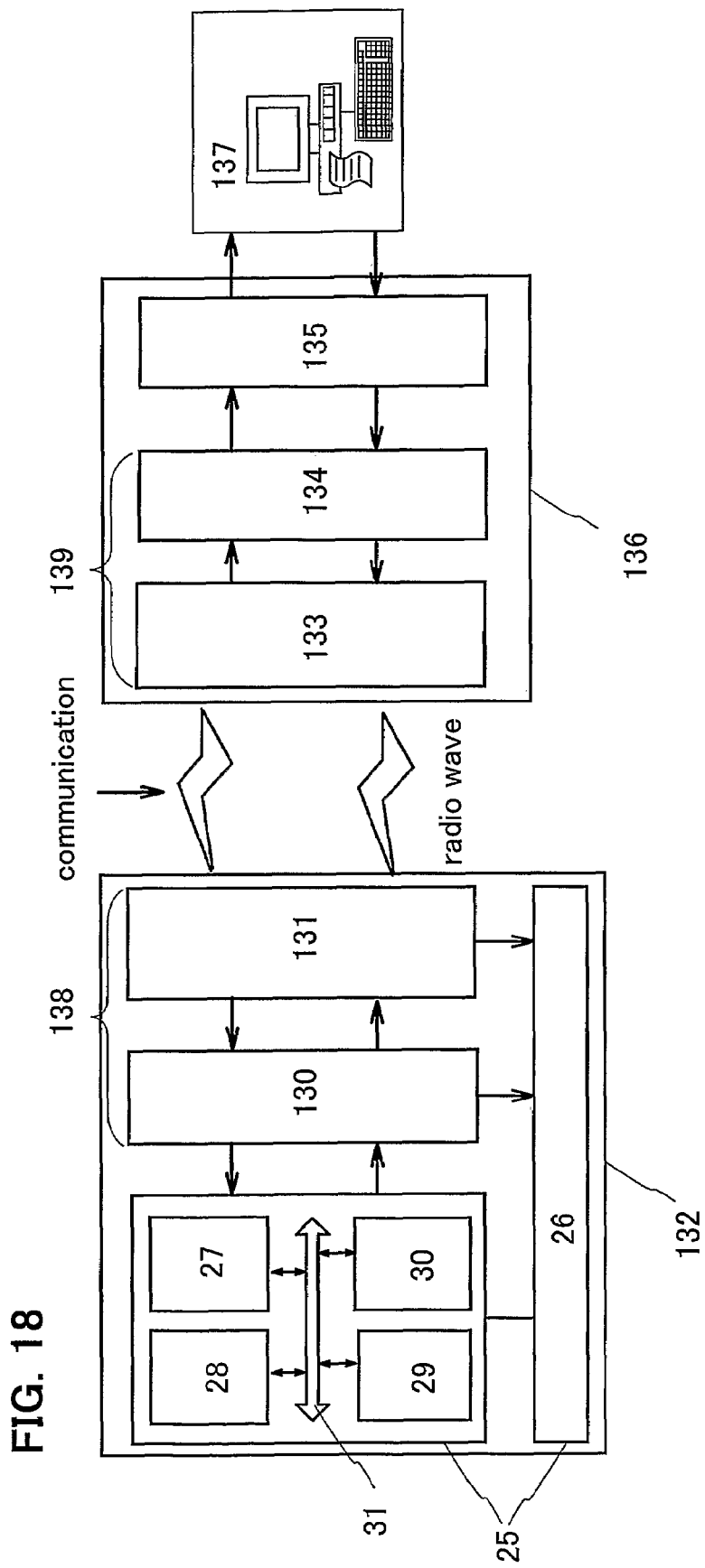
FIG. 18 is a figure describing a principle of a contactless thin film integrated circuit device according to the invention.

Next, a thin film transistor (TFT), an organic TFT, or a thin film diode or the like are formed over the base film 44 to form a thin film integrated circuit 42. FIG. 1A shows the thin film integrated circuit 42 formed of thin film transistors, where a channel region 35, an impurity region 36, a gate insulating film 37, and a gate electrode 38 are formed over the base film 44. In this embodiment mode, a top gate structure is used; however, a bottom gate (inverted staggered) structure can be used instead. Further, an organic TFT or a thin film diode may be used instead of the thin film transistors. Those semiconductor elements form a CPU, a memory and the like of the thin film integrated circuit device. A specific method for manufacturing a thin film integrated circuit such as a CPU and memory using a TFT will be described later. The thin film integrated circuit device includes a power supply circuit, an input/output circuit, a logic circuit, a CPU, and a memory, as shown in FIG. 18. Here, only a CPU 33 and a memory 34 using TFTs are shown in the figure.

Next, a first interlayer insulating film 46 is formed in order to protect the thin film integrated circuit elements. Although a silicon nitride film is formed by plasma CVD here, the first interlayer insulating film 46 is not limited to the film. Further, a second interlayer insulating film 47 is formed for planarization of unevenness due to the thin film integrated circuits. A heat-resistant organic resin such as siloxane, or an organic resin such as polyimide, acrylic, and polyamide, can be used to form the second interlayer insulating film 46 by spin coating, dip coating, spraying, or a droplet discharge method. Alternatively, an inorganic material such as PSG (phosphosilicate glass), BPSG (borophosohposilicate glass), or alumina may be used.

Next, contact holes are formed by etching using a resist as a mask, and a wiring 45 connecting thin film integrated circuits to each other and an antenna 48 are formed. As a conductive material, an element selected from the group consisting of Ag, Au, Al, Cu, Zn, Sn, Ni, Cr, Fe, Co, and Ti, and an alloy including the element can be used. However, the conductive material is not limited thereto. In addition, the wiring and the antenna may be formed from different materials. The wiring 45 and the antenna 48 are formed to contain a metal material with malleability and ductility, and preferably, the film thickness is made thicker to withstand stress due to a deformation.

The wiring 45 and the antenna 48 may be formed by patterning using a resist mask after overall deposition by sputtering. Alternatively, the wiring 45 and the antenna 48 may be selectively formed by a droplet discharge method using a nozzle. The droplet discharge method mentioned here includes not only ink-jet but also offset printing and screen printing.

In the case where a conductive material is used in a commercial product including the thin film integrated circuit device, the same conductive material may be used to form the antenna or the wiring. For example, a material included in a coin can be used to form an antenna inside the coin. In this case, for example, in a case that a thin film integrated circuit device is implanted in a Japanese 10-yen coin, an antenna containing copper, zinc and tin may be formed.

Next, a protective film 49 is formed over the antenna. As the protective film 49, a film containing carbon such as DLC (diamond-like carbon) or carbon nitride (CN), a silicon nitride film, or a silicon nitride film containing oxygen, for example, can be used. Alternatively, a heat-resistant organic resin such as polyimide, acrylic, polyamide, or siloxane can be used, or an inorganic material such as PSG (phosphosilicate glass), BPSG (borophosohposilicate glass), or alumina may be used. Also, epoxy resin may be used for the protective film 49. Such insulating films may be laminated to form the protective film.

The three insulating films of the first interlayer insulating film 46, the second interlayer insulating film 47, and the protective film 49 are formed over the thin film integrated circuits here. The materials of the films may be exchanged with each other Alternatively, a single layer interlayer insulating film may double as the first and second interlayer insulating films. In any case, it is preferable to use heat-resistant materials that are not damaged by etching using halogen fluoride such as $ClF_3$, as materials to be used for these insulating films. (FIG. 1B)

It is preferable to use a highly elastic organic material for the interlayer insulating films 46 and 47 and the protective film 49. Thus, stress due to deformation is concentrated on the insulating films and the protective film containing the organic material, and then these films are mainly deformed. Therefore, stress applied on the thin film integrated circuit is reduced. In addition, since a portion (such as an edge or a corner) on which stress is most applied by the deformation is not an edge of a semiconductor film but an edge of the base film, stress concentration on an edge or interface of the semiconductor film can be suppressed.

Figure 1B:
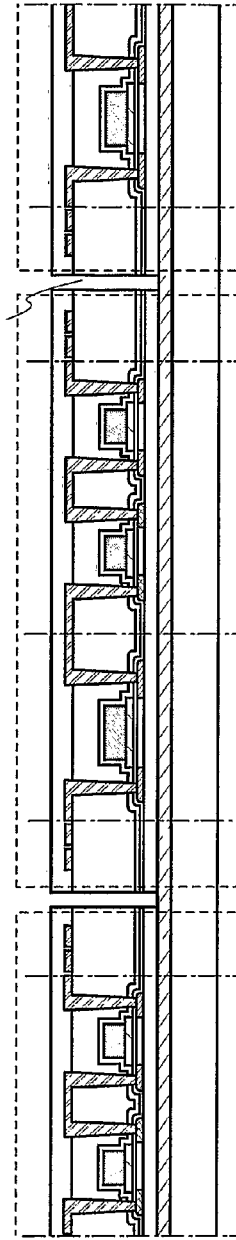

Next, a groove 93 is formed at a boundary between thin film integrated circuit devices 50 by dicing (FIG. 1B). In this case, a blade dicing method using a dicing system (dicer) is commonly used. A blade is a grinding stone into which diamond abrasive grains are implanted, which has a width of about 30 µm to 50 µm. By rapidly spinning the blade, the thin film integrated circuit devices are separated from each other An area required for dicing is referred to as a street, which preferably has a width of 80 µm to 150 µm in consideration of damage to the elements.

Other than dicing, a method such as scribing or etching with the use of a mask can be employed. In the case of scribing, a method such as diamond scribing or laser scribing may be carried out. In the case of etching, a mask pattern is formed by exposure and development, and the elements can be thereafter separated from each other by dry etching, wet etching, or the like. Atmospheric plasma treatment may be carried out in the case of dry etching.

In the case of forming a groove, the groove may have a depth to the point that at least a surface of the peel-off layer is exposed, and it is preferable that the dicing or the like is appropriately controlled in order not to damage the substrate so that the silicon substrate 41 can be reused.

Figure 1C:
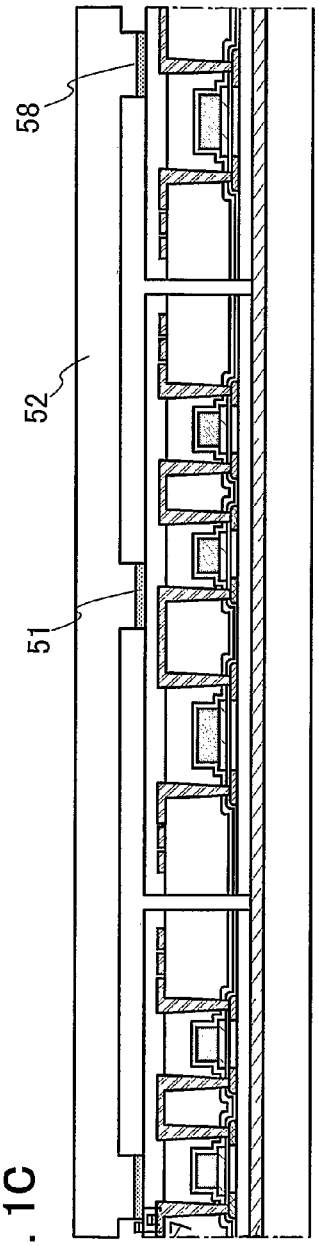

Next, a jig (supporting substrate) 52 with projections 58 is attached to fix each of the thin film integrated circuit devices 50 with a temporary adhesive material 51. The jig has a function of temporarily fixing the plurality of thin film integrated circuit devices in order to prevent thin film integrated circuit devices from separating discretely after removing the peel-off layer. It is preferable that the jig has a structure with projections 58 provided like a comb, as shown in FIG. 1C, in order to make it easier to introduce the gas or liquid containing halogen fluoride later. However, a flat jig may be used as shown in FIG. 4C. In the case of using a jig (supporting substrate) with projections, a patterned substrate may be used. As the jig, for example, a glass substrate or a quartz substrate containing silicon oxide as its main component, which is not damaged by halogen fluoride, or a stainless (SUS) substrate can be used. As long as a material that is not damaged by halogen fluoride is used, the jig is not limited to these substrates. In addition, an adhesive material for temporary bonding is provided between the jig and the thin film integrated circuit device.

As the adhesive material, a material having adhesive force (tack strength) that is reduced or lost by UV light irradiation can be used. An UV peelable tape manufactured by Nitto Denko is used here. In addition to this, an adhesive material that can be attached and detached repeatedly, which is used for products such as "Post-it" (Japanese registered trademark) manufactured by THREE M INNOVATIVE PROPERTIES and "NOTESTIX" (Japanese registered trademark) manufactured by MOORE BUSINESS FORMS INC., may be used. For example, an acrylic adhesive, a synthetic rubber adhesive, and a natural rubber adhesive, described in References 1 to 3 can be used (Reference 1: Japanese Patent Application Laid-Open No. 2001-30403, Reference 2: Japanese Patent No. 2992092, and Reference 3: Japanese Patent Application Laid-Open No. 6-299127). As long as the jig can be easily removed, the adhesive material is not limited to those materials.

Figure 12:
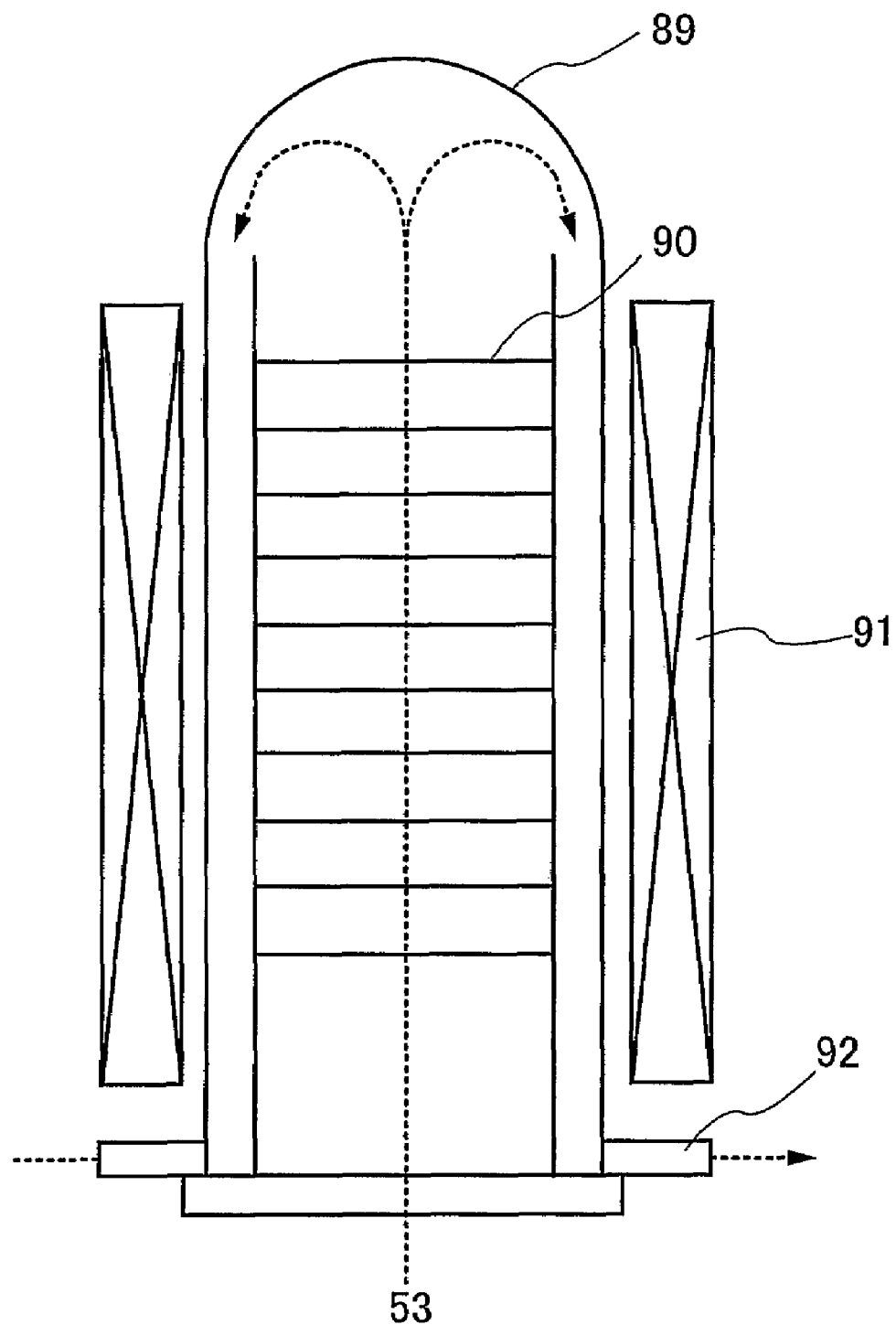
FIG. 12 is a schematic view of an LPCVD system used in the invention.

Next, the a-Si film that is the peel-off layer 43 is etched away by introducing a halogen fluoride gas into the groove 93 (FIG. 2A). A low pressure CVD system (FIG. 12) used here has mechanism in which a halogen fluoride gas 53 such as a $ClF_3$ gas is introduced into a bell jar 89 that is a reaction field so that the gas pervades a substrate 90. In addition, a heater 91 is provided outside the bell jar 89, and remaining gas is exhausted from an exhaust pipe 92. The low pressure CVD system shown in FIG. 12 is used here to etch the a-Si film away under conditions of gas: $ClF_3$, temperature: 350° C., flow rate: 300 sccm, pressure: 6 Torr, and time: 3 hours. However, the conditions are not limited thereto. Alternatively, a gas mixture of $ClF_3$ and nitrogen may be used. The flow rate of the both gases can be appropriately set in this case.

Silicon oxide (SiOx), silicon nitride (SiNx), or silicon oxide containing nitrogen (SiOxNy(x>y)), silicon nitride containing oxygen (SiNxOy(x>y)), is hardly etched by halogen fluoride such as $ClF_3$ while silicon is selectively etched. Accordingly, the peel-off layer 43 is etched with time so that the substrate 41 can be finally peeled (FIG. 2B). On the other hand, since the base film, interlayer insulating films, or protective film including a material such as silicon oxide, silicon nitride, silicon oxide containing nitrogen, silicon nitride containing oxygen, or a heat-resistant resin is hardly etched, damage to the thin film integrated circuits can be prevented. The peeled substrate can be used again, which leads to reduction in cost.

Next, the adhesive force of the temporary adhesive material 51 is reduced or lost by UV light irradiation to separate the jig 52 from the thin film integrated circuit device. This makes it possible to mass-produce thin film integrated circuit devices. It is preferable to reuse the jig for reducing costs.

Figure 3A:
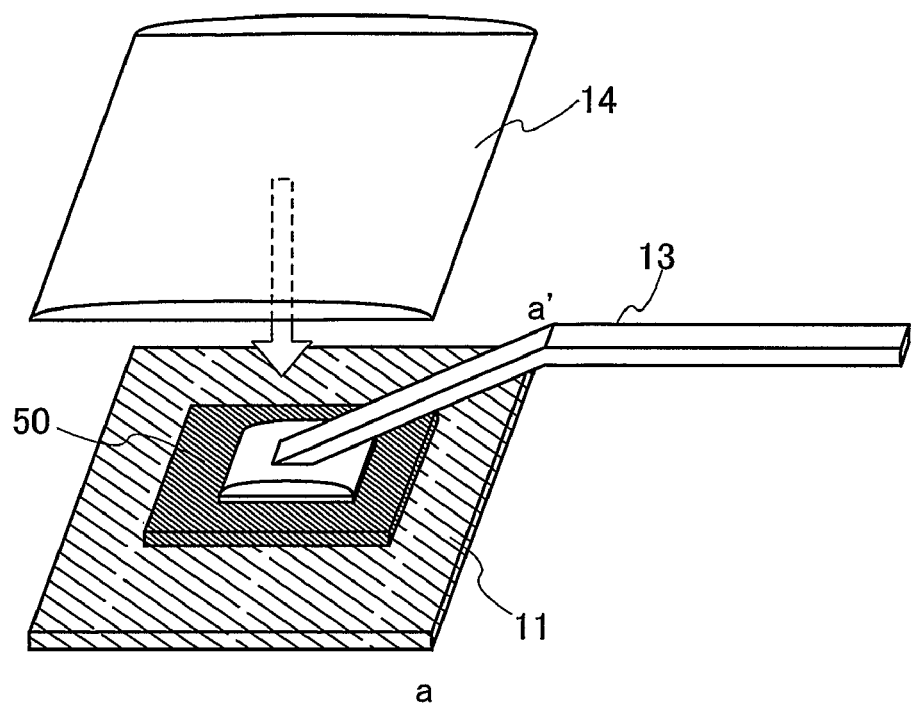
FIGS. 3A and 3B show figures describing a method for attaching a thin film integrated circuit device according to the invention to a product.
Figure 3B:
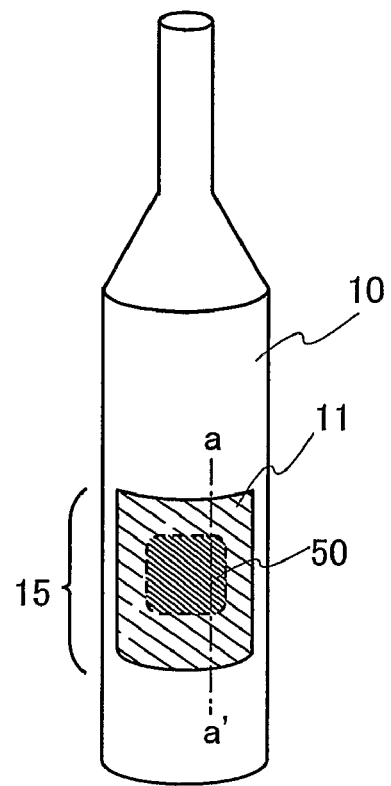

The thin film integrated circuit device 50 manufactured according to the method described above can be carried with the use of, for example, small vacuum tweezers 13, and attached to a desired product. FIGS. 3A and 3B show a method for manufacturing an ID label 15 to be attached to a commercial product 10. The ID label 15 is completed by attaching the thin film integrated circuit device 50 to a label 11 with the small vacuum tweezers 13, and then sealed with an adhesive material 14. Further, the ID label 15 is attached to the commercial product 10 to complete a commercial product with information that can be recognized, updated, and managed by, for example, a reader/writer.

Embodiment Mode 2

In this embodiment mode, a case of using dry etching for forming the groove 93 will be described with reference to FIGS. 4A to 4C. Steps up to the formation of a protective film 49 shown in FIG. 1A have been carried out according to Embodiment Mode 1. Thereafter, a resist 54 is formed over the substrate by exposure and development, and a groove 93 is formed by dry etching using the resist 54 as a mask to separate devices (FIG. 4A). Plasma etching is employed here, and a chlorine-based gas typified by $Cl_2$, $BCl_3$, $SiCl_4$, $CCl_4$, or the like, a fluorine-based gas typified by $CF_4$, $SF_6$, $NF_3$, or $CHF_3$, or the like or $O_2$ is used as an etching gas, which is not limited to these. The etching can be performed by utilizing atmospheric pressure plasma. In this case, it is preferable to use a gas mixture of $CF_4$ and $O_2$ as an etching gas. Alternatively, etching with the use of a different kind of gas may be performed several times to form the groove 93.

Next, a jig 55 is attached to the thin film integrated circuit devices 50 with a temporary adhesive material 51, and the peel-off layer 43 is removed by halogen fluoride such as $ClF_3$ to separate the substrate 41 finally (FIG. 4B). The specific method for removing the peel-off layer 43 is the same as Embodiment Mode 1. As the jig 55, a substrate with no particular projection is used here. Naturally, a substrate with projections may be used instead.

Next, the adhesive force of the temporary adhesive material 51 is reduced or lost by UV light irradiation to separate the jig 55 from the thin film integrated circuit devices 50 (FIG. 4C). This makes it possible to mass-produce thin film integrated circuit devices. The thin film integrated circuit device 50 manufactured according to the method described above can be carried with the use of, for example, small vacuum tweezers, and attached to a desired product.

Embodiment Mode 3

In this embodiment mode, a case will be described, where the substrate 41 is damaged in forming the groove 93 by a method such as dicing and the substrate is reused, with reference to FIGS. 5A and 5B and 6A to 6C.

Figure 5A:
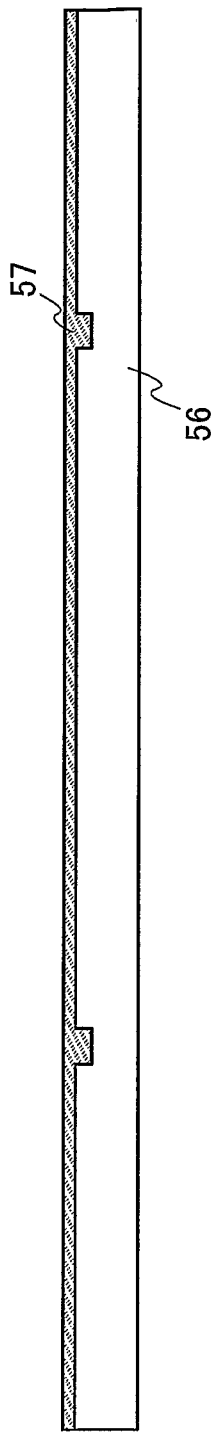
FIGS. 5A and 5B are figures describing the case of reusing a substrate which has been used.
Figure 5B:
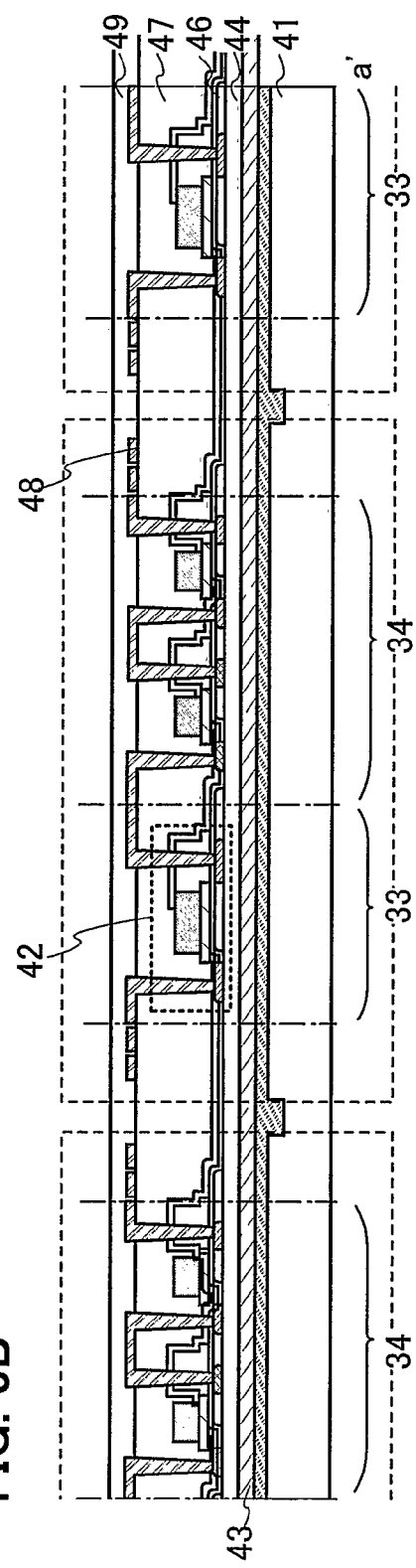

First, a planarizing film 57 is formed on a used substrate 56 as shown in FIG. 5A. As the planarizing film 57, a heat-resistant resin such as polyimide, acrylic, polyamide, or siloxane can be formed by a method such as spin coating, dip coating, spraying, or a droplet discharge method. In consideration of thermal treatment of a post-process, it is preferable to use a heat-resistant resin such as siloxane. Alternatively, an inorganic material such as PSG (phosphosilicate glass), BPSG (borophosohposilicate glass), or alumina may be used. The following processes are the same as in Embodiment Mode 1 or 2 where the thin film integrated circuits are formed and separated to be attached to a desired product.

Figure 6A:
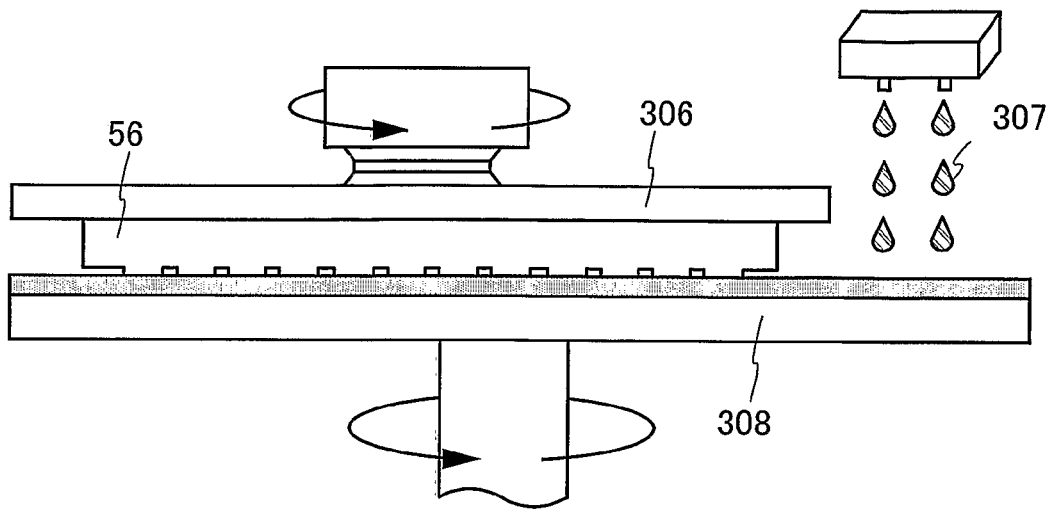
FIGS. 6A to 6C are figures describing a planarization process.
Figure 6B:
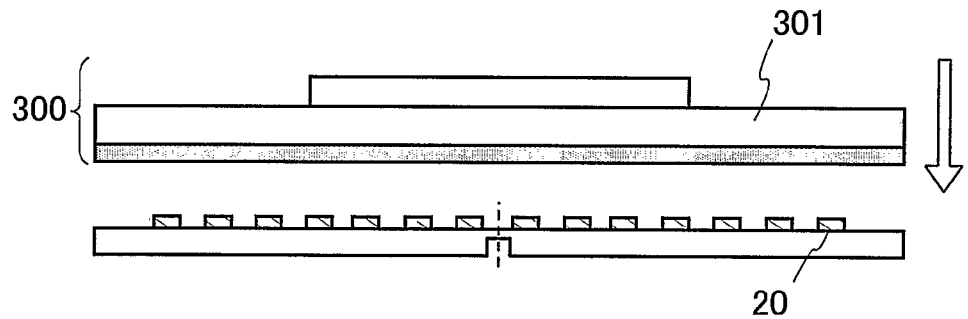
Figure 6C:
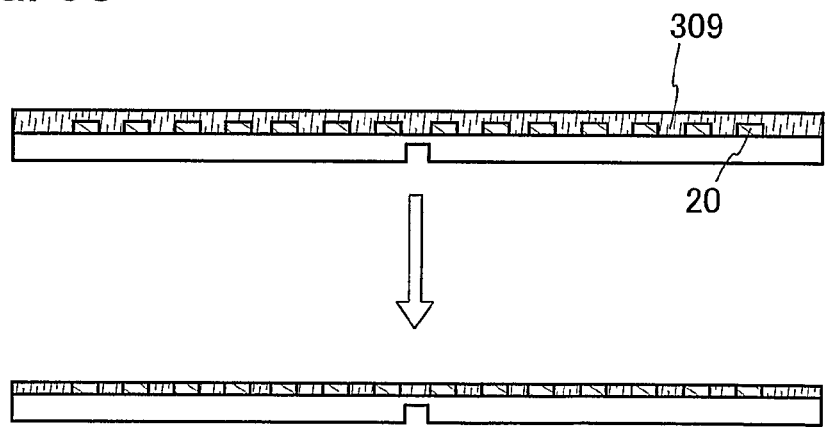

As another method as shown in FIGS. 6A to 6C, there is a method of using CMP (chemical mechanical polishing), pressing, etchback, or the like for planarizing a surface of a substrate, which is particularly effective in the case of CMP (FIG. 6A) where the used substrate 56 has minute scratches. In CMP, a polishing solvent referred to as slurry 307 is supplied on a polishing pad 308, and pressure is applied by spinning of a wafer carrier 306 and spinning of a turntable referred to as a platen and the substrate is polished by the polishing pad 308 for the planarization. As the slurry 307, alkaline slurry mixed with colloidal silica is commonly used. In the case of pressing (FIG. 6B), a system 300 equipped with a heating apparatus such as a heater 301 is preferably used to conduct pressing. In etch back (FIG. 6C), after forming a flat insulating film 309, etching is conducted for planarization. In etch back (FIG. 6C), after forming a flat insulating film 309, etching is conducted for planarization. In the following processes, thin film integrated circuit devices can be formed, separated from each other and attached to a desired product based on Embodiment Mode 1 or 2.

Embodiment Mode 4

In the embodiment modes described above, the antenna is formed in the manufacturing process of a thin film integrated circuit. In this embodiment mode, a method will be described with reference to FIGS. 7A to 7C, 8A to 8E, 9A and 9B, 10A and 10B, and 18, where an antenna to be formed on a substrate and an integrated circuit including a plurality of thin film integrated circuits are separately formed, and thereafter, the both are connected to each other.

Figure 7A:
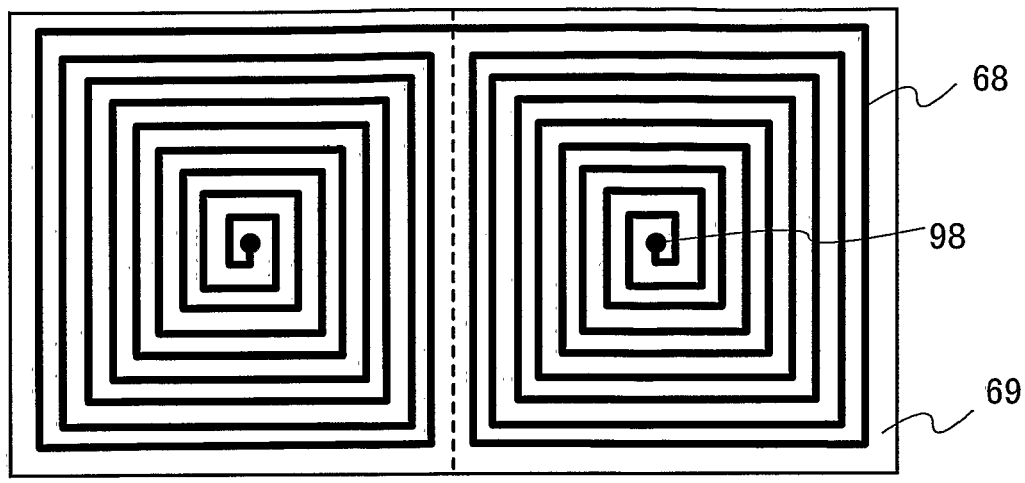
FIGS. 7A to 7C show manufacturing steps of a thin film integrated circuit device according to the present invention (a foldable antenna).
Figure 7B:
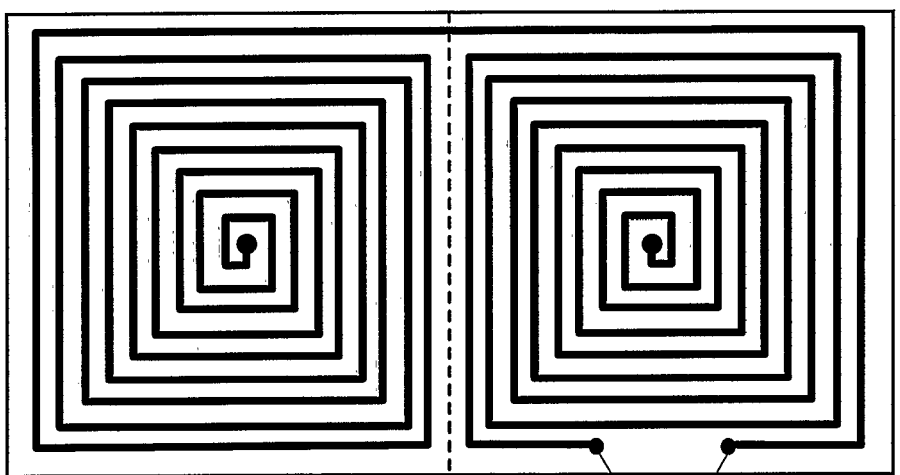

In a first method, as shown in FIGS. 7A, an antenna 68 is formed over a foldable flexible substrate 69, an integrated circuit 25 formed separately is connected to a connection portion 99 of the antenna shown in FIG. 7B, and then, the flexible substrate 69 is folded in half and sealed to manufacture a thin film integrated circuit device as shown in FIG. 7B. The antenna 68 may be formed by patterning after deposition by a method such as sputtering, or by using a droplet discharge method to selectively discharge a composition containing a conductive material, and then, drying and calcining the composition.

After forming the antenna, planarity may be enhanced by a method such as CMP, pressing, or etch back shown in FIGS. 6A to 6C. In the case of CMP, an acid solution mixed with alumina powders is preferably used as slurry since a conductive material is included in the antenna. In the case of pressing, a system equipped with a heating apparatus such as a heater 301 is preferably used to conduct pressing. In etch back, after forming a flat insulating film 309, etching is conducted for planarization. These processes for planarization can also be used in a manufacturing process of a thin film integrated circuit.

The antenna may have a connecting portion 98 connecting antennas to each other and a connecting portion 99 connecting the antenna to an integrated circuit, which are formed when the antenna is formed. Alternatively, the connecting portion 99 connected to a thin film integrated circuit may be formed by cutting a portion of the antenna after forming the antenna. The antenna can be connected to an integrated circuit by using, for example, an anisotropic conductive film or a known bonding method. The shape of the antenna is not limited to the shape shown in FIGS. 7A to 7C as long as the antenna is symmetric and coiled when the substrate is folded.

The integrated circuit 25 enfolded with the antenna includes a power supply circuit 26, an input/output circuit 27, a logic circuit 28, a memory 29, a CPU 30, which are connected to an antenna circuit that exchanges radio waves with a reader/writer 136, as shown in FIG. 18.

Figure 7C:
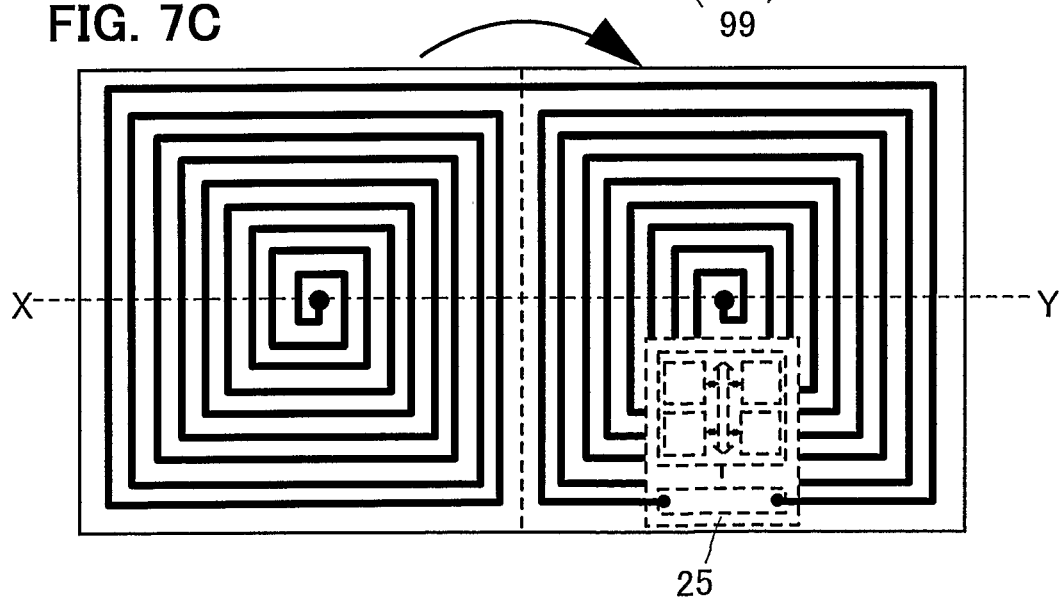
Figure 8A:
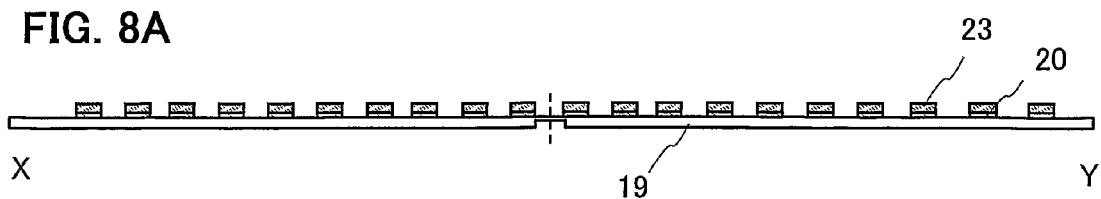
FIGS. 8A to 8E show manufacturing steps of a thin film integrated circuit device according to the present invention (a foldable antenna).
Figure 8B:
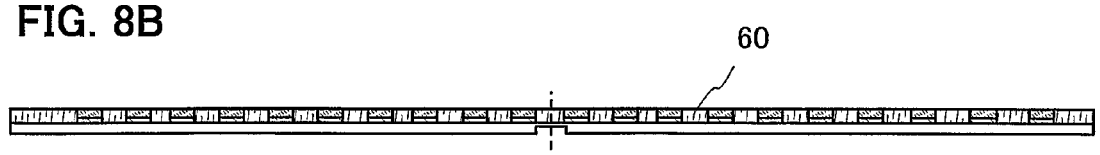
Figure 8C:
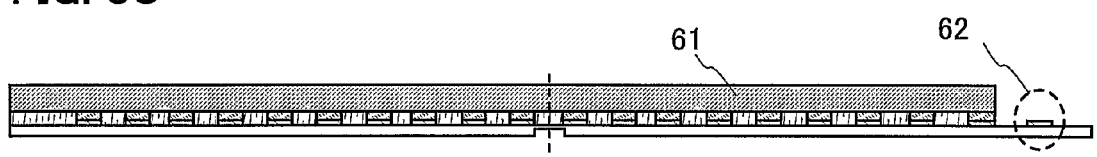
Figure 8D:
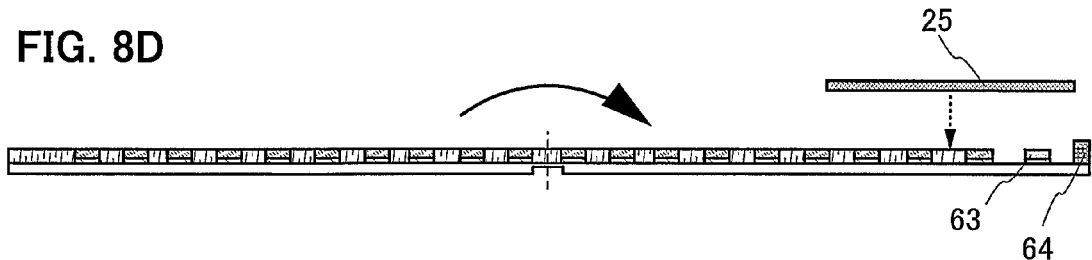
Figure 8E:
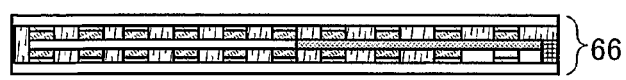

FIGS. 8A to 8E are diagrams showing the folded antenna substrate, viewed from a X-Y section of FIG. 7C. A resist 23 used for patterning the antenna 20 is left without being removed by, for example, ashing. Further, planarization is carried out by a method such as spin coating, dip coating, spraying, or a droplet discharge method using a planarizing film 60 (FIG. 8B). In order to obtain a portion connecting to the integrated circuit 25 (IC chip), etching or ashing is performed using a resist 61 as a mask to form a contact portion 62 (FIG. 8C). Further, the integrated circuit 25 is formed with an anisotropic conductive film 63 therebetween, and the flexible substrate 19 on which the antenna 20 is formed is folded with a sealing material 64 (FIG. 8D); thus, a thin film integrated circuit device 66 is completed (FIG. 8E). In this case, a wiring or the like may be provided between opposite antennas in order to connect the antennas together. The resist 23 and the planarizing film 60 serve as a buffer to protect the antenna and the thin film integrated circuit when the substrate is folded. One or both of the resist 23 and the planarizing film 60 may be omitted.

Figure 9A:
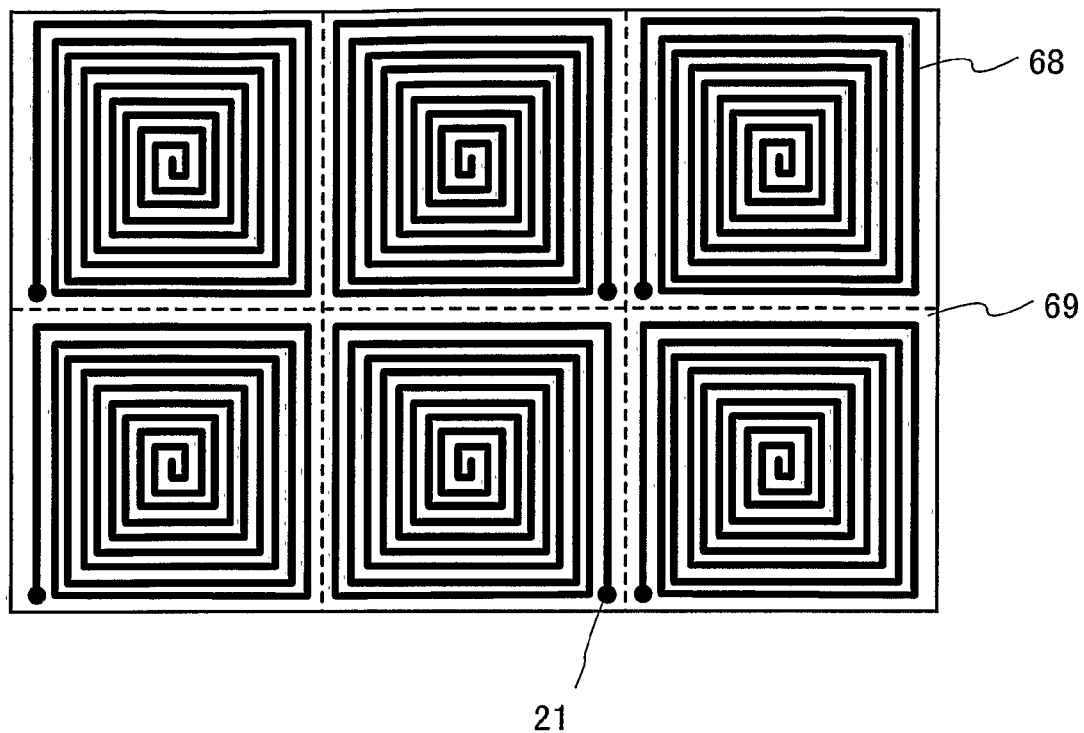
FIGS. 9A and 9B show manufacturing steps of a thin film integrated circuit device according to the present invention (sandwich structure).
Figure 9B:
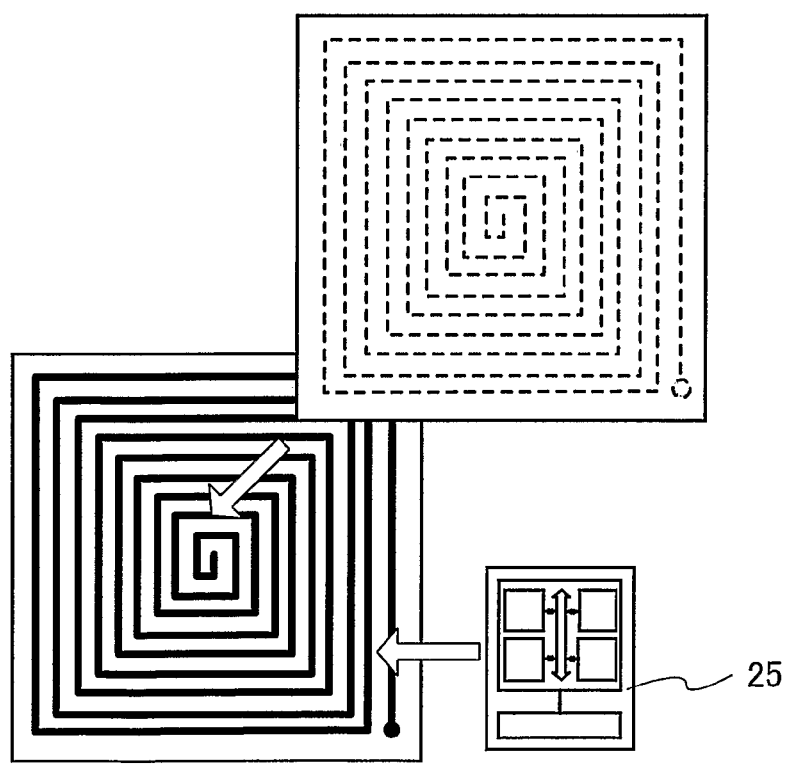

In a second method, as shown in FIGS. 9A and 9B, a plurality of antennas 68 are formed over a substrate 69, the substrate 69 is carved out by dicing or the like, and an integrated circuit 25 is interposed between the antenna substrates. A connecting portion 21 may be used to connect the antennas together or connect the thin film integrated circuit to the antenna. In addition, the connecting portion 21 may be formed at another position of the antenna. Since it is necessary to provide an alignment mark when the substrates are bonded to each other, the connecting portion 21 may be used as a mark.

Figure 10A:
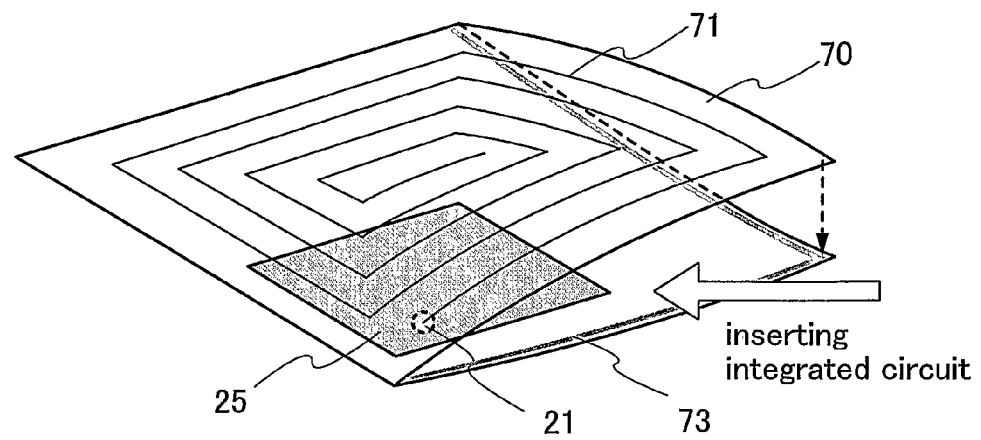
FIGS. 10A and 10B show manufacturing steps of a thin film integrated circuit device according to the present invention (wrap/envelope structure).
Figure 10B:
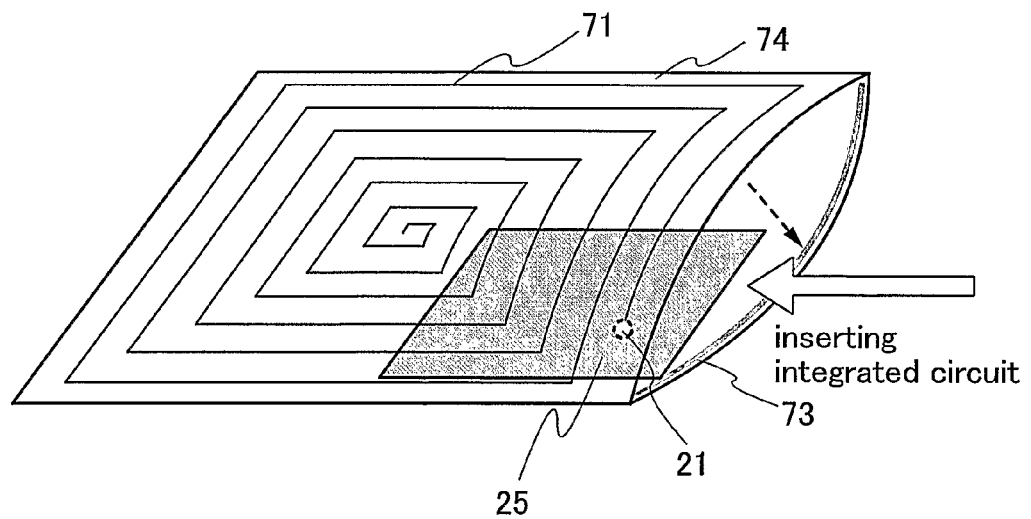

In a third method, as shown in FIG. 10A or 10B, an antenna 71 is formed on each outside surface of a flexible substrate 70 with two sides closed like a plastic wrap for wrapping food (FIG. 10A) or a flexible substrate 74 with three sides closed like an envelope (FIG. 10B), an integrated circuit (IC chip) 25 is put between the outside surfaces, and sealing is performed using an adhesive material 73. A connecting portion 21 is an opening so that the antennas can be connected to each other or the antenna is connected to the integrated circuit. The IC chip may be placed with the use of, for example, small vacuum tweezers. The antenna may be formed on each inside surface of the substrate.

The method for manufacturing a thin film integrated circuit device, described in this embodiment mode, is suitable particularly in the case where an antenna substrate and an integrated circuit (IC chip) are formed separately by different manufacturers to be distributed as an intermediate product (part).

Embodiment Mode 5

Figure 11A:
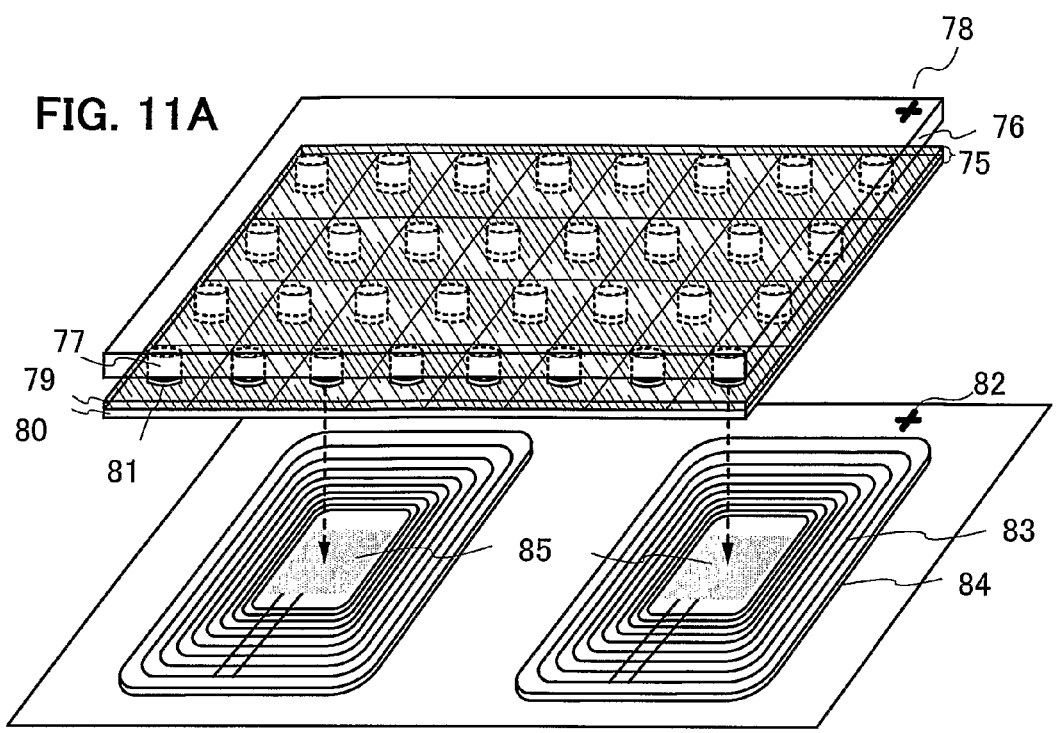
FIGS. 11A to 11C show manufacturing steps of an ID card according to the present invention (selective UV light irradiation).
Figure 11B:
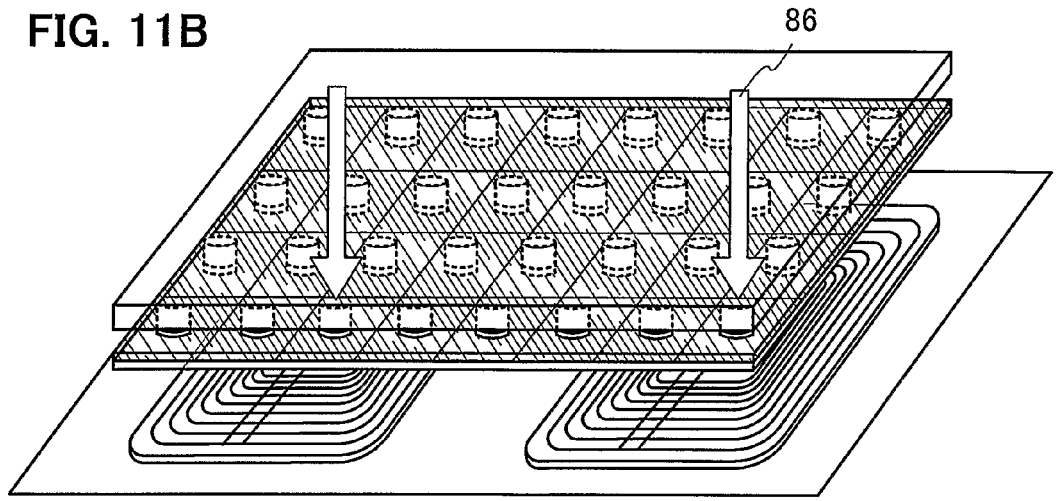
Figure 11C:
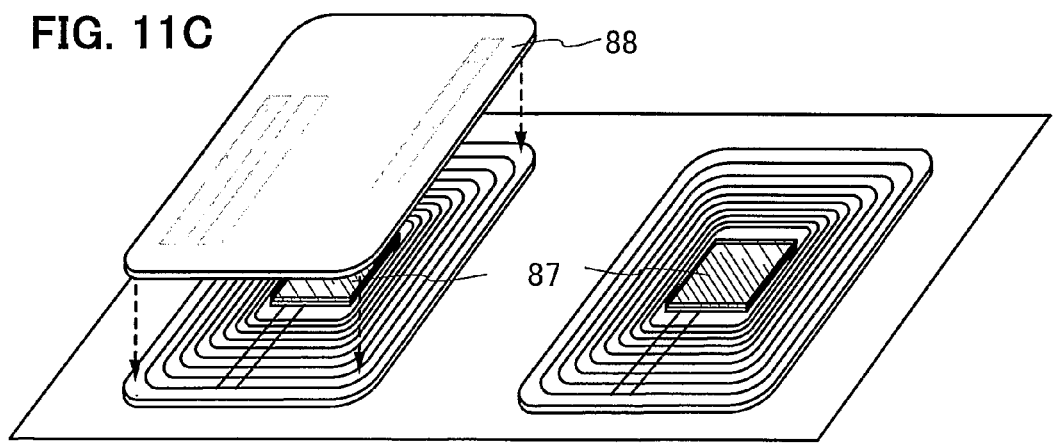

In this embodiment mode, a method for bonding an element substrate 75 to a commercial product 84 or the like without removing a jig 76 temporarily bonded to the element substrate 75 will be described with reference to FIGS. 11A to 11C. First, based on Embodiment Modes 1 to 3, the element substrate 75 is formed, and the jig is attached with a temporary adhesive material 81. As the jig 76, a jig with projections 77 is used as shown in FIGS. 11A and 11B. As the temporary adhesive material 81, a material having adhesive force that is reduced or lost by UV light irradiation is used here. In addition, an interlayer film 79 including an organic material or an inorganic material is provided in order to prevent damage to elements. Then, the elements are separated from each other by etching with halogen fluoride such as $ClF_3$.

Next, the elements with the jig 76 bonded temporarily are transferred in the state that elements are attached temporally to the jig 76 and aligned with a stage on which the commercial product such as an ID card. In this case, alignment marks 78 and 82 provided on the jig and the stage can be used as shown in FIG. 11A, and not shown in the figure, but a mark formed on the commercial product 84 may be used. At a portion of the commercial product 84 where the thin film integrated circuit device is to be formed, an adhesive material 85 is formed in advance, and a desired element is attached to a desired portion of the commercial product 84 by controlling the jig (FIG. 11A).

Next, the element to be attached to the commercial product 84 is irradiated selectively with UV light 86 through a mask to reduce or lose adhesive force of the temporary adhesive material 81, and thereby separating the jig from the element (FIG. 11B). This makes it possible to form a desired element (an integrated circuit 87) at a desired portion of the commercial product. After forming the element, the element is covered with, for example, a cover 88 (FIG. 11C). An antenna 83 is formed in the commercial product here; however, an antenna may be formed in the element portion.

By using the method described in this embodiment mode according to the invention, a desired element can be formed at a desired portion without allowing the elements to separate discretely when the elements are separated from each other by etching with halogen fluoride such as $ClF_3$.

Embodiment 1

In this embodiment, a specific method for manufacturing an integrated circuit area of a thin film integrated circuit device will be described with reference to FIGS. 13A to 13E and FIG. 14A to FIG. 14E. For simplification, a method for manufacturing a CPU and a memory using an n-channel TFT and a p-channel TFT will be described here.

Figure 13A:
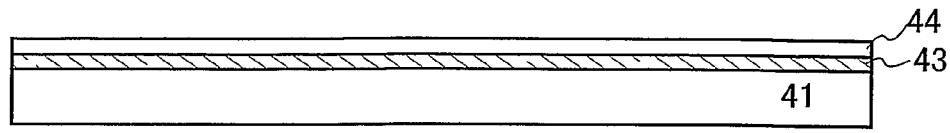
FIGS. 13A to 13E show manufacturing steps of a CPU and a memory according to the invention.

First, a peel-off layer 43 and a base film 44 are formed over a substrate 41 (FIG. 13A). As materials and methods for forming the substrate 41, the peel-off layer 43, and the base film 44, the materials and methods described in the above Embodiment Modes 1 to 5 can be employed.

Next, island-shaped semiconductor films 100 are formed over the base film 44. The island-shaped semiconductor films 100 may be formed to contain an amorphous semiconductor, a crystalline semiconductor, or a semi-amorphous semiconductor. In any case, a semiconductor film containing silicon, silicon-germanium (SiGe), or the like as its main component may be used.

In this embodiment, a 70 nm-thick amorphous silicon film is formed, the surface of the amorphous silicon film is treated with a catalyst element which promotes silicon crystallization, for example, a solution containing nickel, then, a crystalline silicon semiconductor film is obtained by a thermal crystallization process at 500° C. to 750° C., and laser crystallization is further performed to improve its crystallinity. As a method for forming the amorphous silicon film, a method such as plasma CVD, sputtering, or LPCVD may be used. As a method for crystallization, a method such as laser crystallization, thermal crystallization, or thermal crystallization using another catalyst element (such as Fe, Ru, Rh, Pd, Os, Ir, Pt, Cu, or Au) may be used, or the above-mentioned methods may be used alternately more than once.

For crystallization of a semiconductor film with an amorphous structure, a continuous-wave laser may be used. In order to obtain a large-grain crystal by crystallization, it is preferable to use a continuous-wave solid laser and apply any of the second to fourth harmonics of the fundamental waves. Typically, the second harmonic (532 nm) or third harmonic (355 nm) of Nd:YVO$_4$ laser (fundamental wave: 1064 nm) may be used. In the case of using a continuous-wave laser, laser light emitted from continuous-wave YVO$_4$ laser (output: 10 W) is converted into a harmonic by a non-linear optical element. There is also a method in which a YVO$_4$ crystal and a non-linear optical element are put in which in a resonator to emit a harmonic. Then, an object to be processed is irradiated with rectangular or elliptic laser light which is preferably shaped by an optical system. In this case, an energy density of approximately 0.01 to 100 MW/cm$^2$ (preferably, 0.1 to 10 MW/cm$^2$) is necessary. The semiconductor film may be moved at a speed of approximately 10 to 2000 cm/s relatively with respect to the laser light.

After obtaining the crystalline silicon semiconductor film according to the method described above, an amorphous silicon film for gettering of the metal catalyst is formed over the semiconductor film with a silicon oxide film interposed therebetween, and gettering is conducted by a thermal treatment at 500° C. to 750° C. Further, in order to control a threshold voltage of a TFT, the crystalline silicon semiconductor film is doped with boron ions of a dose amount on the order of $10^{13}$/cm$^2$. After that, the island-shaped semiconductor films 100 are formed by etching with a resist as a mask.

In forming the crystalline semiconductor film, disilane (Si$_2$H$_6$) and germanium fluoride (GeF$_4$) may be used as a material gas to form a polycrystalline semiconductor film directly by LPCVD (Low Pressure CVD) so that a crystalline semiconductor film can be obtained. In this case, the gas flow ratio may be Si$_2$H$_6$/GeF$_4$=20/0.9, the deposition temperature may be 400° C. to 500° C., and He or Ar may be used as a carrier gas. However, the conditions are not limited to these.

Figure 13B:
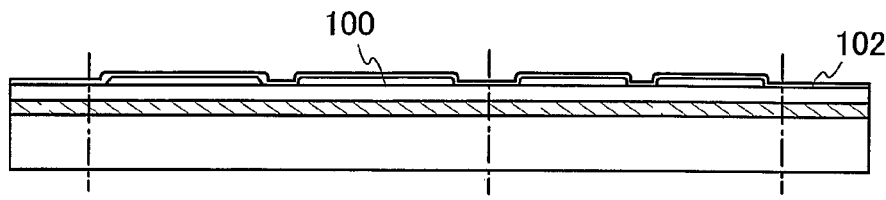

Next, a gate insulating film 102 is formed over the island-shaped semiconductor films 100 (FIG. 13B). It is preferable that a method for forming a thin film such as plasma CVD or sputtering is used to form a single layer or laminated layers of a layer containing silicon nitride, silicon oxide, silicon nitride containing oxygen, or silicon oxide containing nitrogen for the gate insulating film 102. In the case of the laminated layers, for example, a three-layered structure of, from the substrate side, a silicon oxide film, a silicon nitride film, and a silicon oxide film may be preferably employed.

Figure 13C:
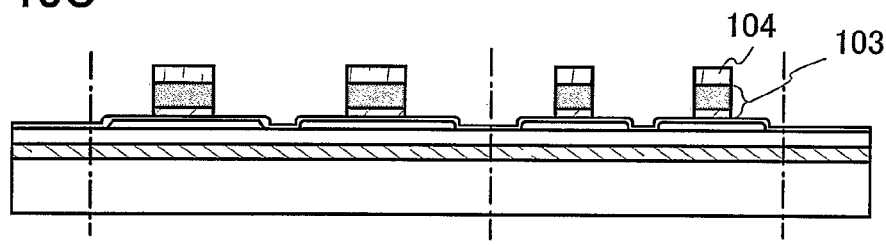

Next, a gate electrode 103 is formed (FIG. 13C). By etching using a resist 104 as a mask after forming and laminating TaN (tantalum nitride) with a film thickness of 30 nm and W (tungsten) with a film thickness of 370 nm by sputtering, the gate electrode 103 is formed. Instead of the resist mask, a mask such as SiOx may be used. In this case, a step of forming a mask of such as silicon oxide or silicon oxide containing nitrogen (referred to as a hard mask) by patterning is added. However, since the thickness of the mask is less reduced by etching than the resist, a gate electrode with a desired width can be formed. Of course, the materials, structures, or manufacturing method of the gate electrode 103 is not limited to these, and can be selected appropriately. For example, without using the resist 104, a droplet discharge method may be used to form the gate electrode 103 selectively.

A conductive material for forming the gate electrode 103 can be selected from various materials depending on the function of the conductive film. Typically, silver (Ag), copper (Cu), gold (Au), nickel (Ni), platinum (Pt), chromium (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimonial lead, antimony tin oxide, fluorine-doped zinc oxide, carbon, graphite, glassy carbon, lithium, beryllium, sodium, magnesium, potassium, calcium, scandium, manganese, gallium, niobium, a sodium-potassium alloy, mixtures such as a magnesium/copper mixture, a magnesium/silver mixture, a magnesium/aluminum mixture, a magnesium/indium mixture, an aluminum/aluminum oxide mixture, and a lithium/aluminum mixture, particles or dispersed nanoparticles of silver halide, and indium tin oxide (ITO), ITSO (ITO including silicon or silicon oxide), zinc oxide (ZnO), gallium-doped zinc oxide (GZO), indium zinc oxide (IZO) of indium oxide mixed with zinc oxide at 2% to 20%, an organic indium compound, an organic tin compound, and titanium nitride and the like, which are used as a transparent conductive film, can be appropriately employed.

As an etching gas in the case of forming the gate electrode 103 by etching, a gas mixture of CF$_4$/Cl$_2$/O$_2$ or Cl$_2$ gas is used. However, the etching gas is not limited thereto.

Figure 13D:
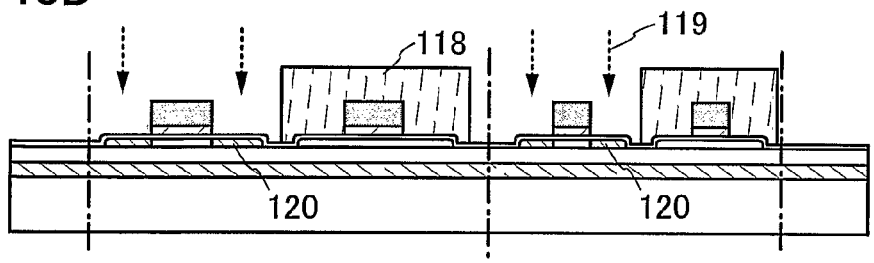

Next, portions to be p-channel TFTs 109 and 111 are covered with a resist 118, and the island-shaped semiconductor films to be n-channel TFTs 108 and 110 are doped with an impurity element 119 (typically, P (phosphorus) or As (arsenic)) providing n-type conductivity at a lower concentration with the gate electrode as a mask (FIG. 13D). The conditions of the first doping process are as follows: dose amount: $1\times10^{13}$ atoms/cm$^2$ to $6\times10^{13}$ atoms/cm$^2$; and accelerating voltage: 50 kV to 70 kV. However, the conditions are not limited thereto. This first doping process makes doping through the gate insulating film 102 to form pairs of lower concentration impurity regions 120. The first doping process may be applied all over the area without covering the p-channel TFT regions with the resist.

Figure 13E:
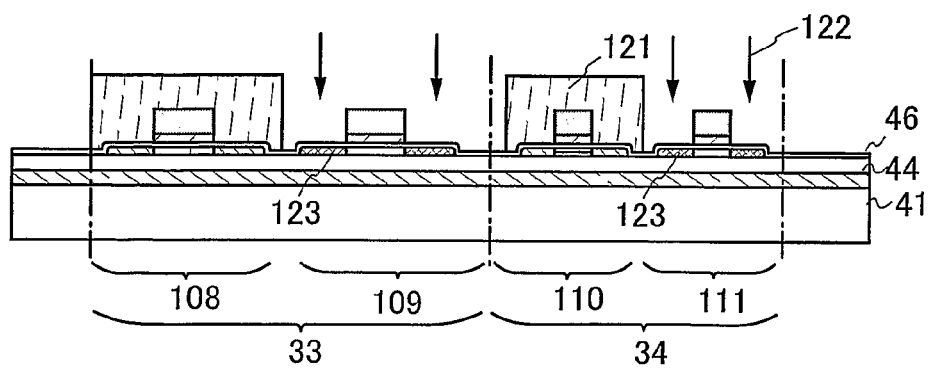

Next, after removing the resist 118 by a method such as ashing, a resist 121 is newly formed to cover n-channel TFT regions, and the island-shaped semiconductor films to be the p-channel TFTs 109 and 111 are doped with an impurity element 122 (typically, B (boron)) imparting p-type conductivity at a higher concentration with the gate electrode as a mask (FIG. 13E). The second doping process is performed under conditions as follows: dose amount: $1\times10^{16}$ atoms/cm$^2$ to $3\times10^{16}$ atoms/cm$^2$; and accelerating voltage: 20 kV to 40 kV. This second doping process makes doping through the gate insulating film 102 to form pairs of higher concentration p-type impurity regions 123.

Figure 14A:
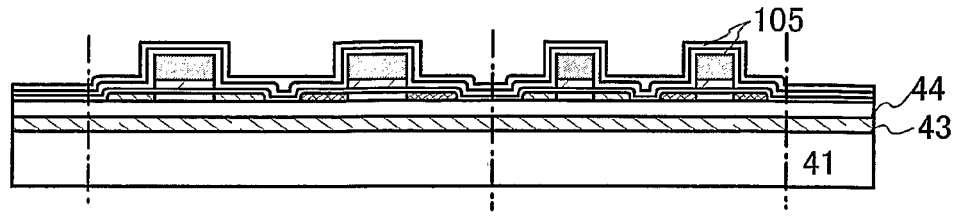
FIGS. 14A to 14E show manufacturing steps of a CPU and a memory according to the invention.

Next, after removing the resist 121 by a method such as ashing, an insulating film 105 is formed over the substrate (FIG. 14A). A two layer structure of a 100 nm-thick (SiON) film of silicon oxide containing nitrogen and a 200 nm-thick low temperature oxide film is employed. Here, the SiON film is formed by plasma CVD, and an silicon oxide film is formed by low pressure CVD for the low temperature oxide film. After that, not shown in the figure, the surface of the substrate where the TFTs are formed is covered with a resist, and an insulating film formed on the backside is removed by etching (back surface treatment).

Figure 14B:
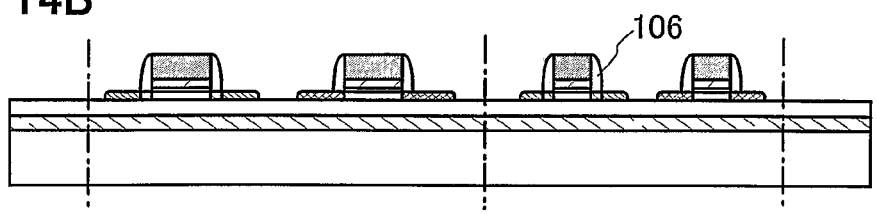

Next, with the resist left, the resist and the insulating film 105 are etched and removed by etch back to form sidewalls 106 in a self-aligned manner (FIG. 14B). As an etching gas, a gas mixture of CHF$_3$ and He is used. The process of forming the sidewalls is not limited thereto.

Figure 14C:
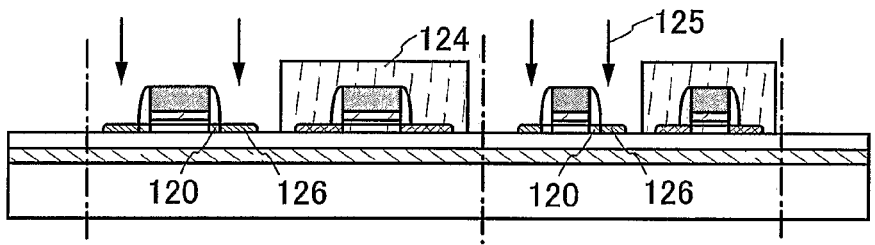

Next, a resist 124 is newly formed to cover the p-channel TFT regions, and an impurity element 125 (typically, P (phosphorus) or As (arsenic)) providing n-type conductivity is doped at a higher concentration using the gate electrodes 103 and the sidewalls 106 as masks for a third doping process (FIG. 14C). The third doping process is performed under conditions as follows: dose amount: $1 \times 10^{13}$ atoms/cm$^2$ to $5 \times 10^{15}$ atoms/cm$^2$ and accelerating voltage: 60 kV to 100 kV. This third doping process through the gate insulating film 102 is performed to form pairs of higher concentration n-type impurity regions 126.

Although not shown in the figure, the impurity regions may be thermally activated after removing the resist 124 by ashing or the like. For example, a heat treatment may be performed at 550° C. for 4 hours under a nitrogen atmosphere after forming a silicon oxide film containing nitrogen to a thickness of 50 nm. Further, after a silicon nitride film (SiNx film) containing hydrogen is formed to a film thickness of 100 nm, heat treatment is carried out at 410° C. for 1 hour under a nitrogen atmosphere; thus, defects of the crystalline semiconductor film can be partially repaired. This is a process, for example, for terminating dangling bonds existing in crystalline silicon, and is referred to as a hydrogenation treatment process. Further, after that, a SiON film is formed to a film thickness of 600 nm as a cap insulating film for protecting the TFTs. The hydrogenation treatment process may be performed after forming the SiON film. In this case, a silicon oxide film containing nitrogen is formed over a silicon nitride film thereby continuously forming the insulating film. In this way, the insulating film having the three layers of the silicon oxide film containing nitrogen, the silicon nitride film, and the silicon oxide film containing nitrogen (in this order from the substrate side) is formed over TFTs. However, the structure or materials of the insulating films are not limited to these. These insulating films, which also have a function of protecting the TFTs, are preferably formed.

Next, an interlayer insulating film 107 is formed over the TFTs. A heat-resistant organic resin such as polyimide, acrylic, polyamide, or siloxane can be used to form the interlayer insulating film 107. As a forming method thereof, a method such as spin coating, dip coating, spraying, or a droplet discharge method (ink-jet printing, screen printing or offset printing), a doctor knife, a roll coater, a curtain coater, or a knife coater can be employed depending on the material. Also, an inorganic material may be used, and in this case, a film including a material such as PSG (phosphosilicate glass), BPSG (borophosohposilicate glass), or alumina can be used. Insulating films containing the above materials may be laminated to form the interlayer insulating film 107.

Figure 14D:
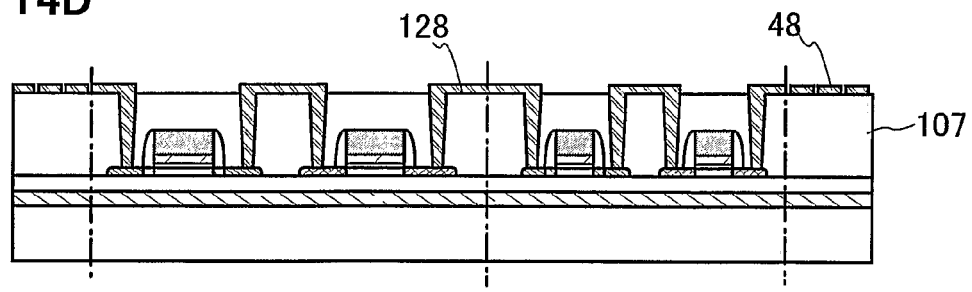

Next, after forming a resist, contact holes are formed by etching, and then a wiring 128 and an antenna 48 are formed (FIG. 14D). As a gas to be used for etching for forming the contact holes, a gas mixture of CHF$_3$ and He is used. However, the gas to be used for etching is not limited thereto.

The wiring 128 and the antenna 48 may be formed at the same time by using the same material, or may be formed separately. The wiring 128 connected to the TFT has a five-layered structure of Ti, TiN, Al—Si, TiN, Ti (laminated in this order) here, which is formed by patterning and sputtering thereafter.

By mixing Si in the Al layer, a hillock can be prevented from being generated in resist baking of the patterning of a wiring. Instead of Si, Cu may be mixed in at approximately 0.5%. In addition, by sandwiching the Al—Si layer between Ti layers or TiN layers, the hillock-resistant property is further improved. In the patterning, it is preferable to use the above-mentioned hard mask containing a material such as silicon oxide containing nitrogen (SiON) or the like. The materials or forming method of the wring are not limited thereto. The above-mentioned materials to be used for the gate electrode may be employed instead. When the antenna 48 is formed, the various materials and methods described in the above embodiment modes can be used. The wiring and the antenna may be formed at the same time, or after forming one of the wiring and the antenna first, and the other may be formed thereafter to overlap the one.

Figure 14E:
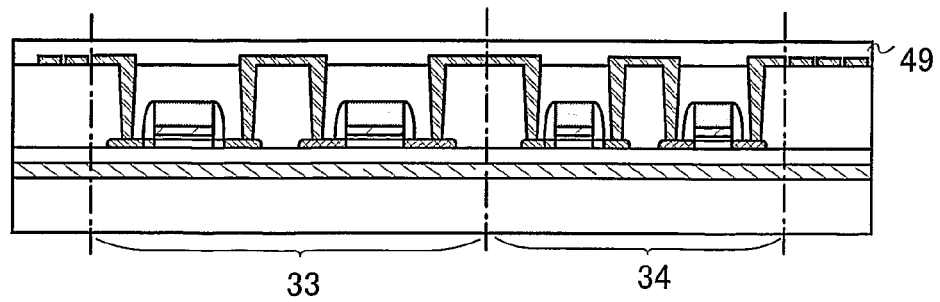

Next, a protective film 49 is formed over the wiring and the antenna to complete a CPU 33 and a memory 34 (FIG. 14E). As the protective film 49, a film containing carbon such as DLC (diamond-like carbon) or carbon nitride (CN), a silicon nitride film; or a silicon nitride film containing oxygen, for example, can be used. As a forming method thereof, plasma CVD or atmospheric plasma can be used.

Alternatively, a photosensitive or non-photosensitive organic material such as polyimide, acrylic, polyamide, benzocyclobutene of a resist material; or a heat-resistant organic resin such as siloxane can be used to form the protective film 49. As a forming method thereof, a method such as spin coating, dip coating, spraying, or a droplet discharge method (such as ink-jet printing, screen printing, or off-set printing), a doctor knife, a roll coater, a curtain coater, or a knife coater can be employed depending on the material. Alternatively, an SOG film (for example, a SiOx film including an alkyl group) obtained by coating can also be used. Also, an inorganic material may be used, and in this case, a film containing a material such as silicon oxide, silicon nitride, silicon oxide containing nitrogen, silicon nitride containing oxygen, PSG (phosphosilicate glass), BPSG (borophosohposilicate glass), or alumina can be used. Insulating films respectively containing the above materials may be laminated to form the protective film 49.

After that, in manner of the above embodiment mode, the plurality of TFTs manufactured according this embodiment can be separated for each IC chip, which can be incorporated into commercial products. Although the TFTs have a top-gate structure in this embodiment, a bottom gate (inverted-staggered) structure may be employed. The present embodiment can be freely combined with any of the other embodiment modes and embodiments.

Embodiment 2

In this embodiment, the case of employing high-temperature polysilicon (HPS) in a process according to Embodiment 1 will be described. In general, a semiconductor process including a crystallization process at the upper temperature limit (about 600° C.) of a glass substrate or more is referred to as a high-temperature process.

After forming a semiconductor film, the above-mentioned catalyst such as Ni, Fe, Ru, Rh, Pd, Os, Ir, Pt, Cu, Au, or the like is added to the semiconductor film, and then heat treatment is performed in an LPCVD furnace. At about 700° C. or more, a crystal nucleus is generated in the semiconductor film and crystallization is progressed.

After that, a gate insulating film is formed by LPCVD after forming island-shaped semiconductor films. For example, gas of a silane-based gas mixed with N$_2$ or O$_2$ is used to form a high temperature oxide film at a high temperature of 900° C. or more.

Next, by depositing polysilicon (p-Si) containing an n-type impurity such as phosphorus to a film thickness of 150 nm, a gate electrode is formed. Further, W—Si (tungsten silicide) may be deposited to a film thickness of 150 nm. As a forming method thereof, a method such as sputtering or CVD can be appropriately employed. Doping processes thereafter can be performed in the same way as in Embodiment 1.

After the doping processes, thermal activation at 950° C. for 30 minutes is performed to activate the impurity regions. Further, BPSG (borophosohposilicate glass) is used for reflow, and planarization is conducted by etch back using a resist. Furthermore, hydrogenation annealing at 350° C. is performed to repair plasma damage.

The other processes can be performed in the same way as in Embodiment 1. Although the TFTs have a top-gate structure in this embodiment, a bottom gate structure (inverted staggered structure) may be employed. The present embodiment can be freely combined with any of the other embodiment modes and embodiments.

Embodiment 3

In this embodiment, the case of employing semiamorphous silicon (SAS) for the island-shaped semiconductor films 100 in a process according to Embodiment 1 will be described. The SAS can be obtained by glow discharge decomposition of silicide gas. $SiH_4$ is a typical silicide gas, and in addition, it is also possible to use a gas such as $Si_2H_6$, $SiH_2Cl_2$, $SiHCl_3$, $SiCl_4$, or $SiF_4$. When this silicide gas is used after being diluted with one or more rare gas elements selected from the group consisting of hydrogen, hydrogen and helium, argon, krypton, and neon, the SAS can be easily formed. It is preferable to dilute the silicide gas at a dilution ratio in the range of 10 to 1000 times. Of course, under reduced pressure, which may be in the range of approximately 0.1 Pa to 133 Pa, a film is formed by glow discharge decomposition. In order to generate glow discharge, electric power from 1 MHz to 120 MHz, preferably high-frequency power from 13 MHz to 60 MHz may be supplied. The substrate heating temperature is preferably 300° C. or less, and a substrate heating temperature from 100° C. to 200° C. is recommended.

In addition, a carbide gas such as $CH_4$ or $C_2H_6$ or a germanide gas such as $GeH_4$ or $GeF_4$ may be mixed in the silicide gas to control the energy band width to be 1.5 eV to 2.4 eV or 0.9 eV to 1.1 eV.

The SAS shows a weak n-type electric conductivity when no impurity element is added purposefully for valence electron control. This is because oxygen is easily mixed in the semiconductor film by glow discharge at a higher electric power than in the case of depositing an amorphous semiconductor. Consequently, an impurity element providing p-type conductivity is doped in the semiconductor film, in which a channel region of a TFT is provided at the same time as the deposition or after the deposition; thus, it becomes possible to control a threshold voltage. As the impurity element providing p-type conductivity, boron is common, and an impurity gas such as $B_2H_6$ or $BF_3$ may be mixed in the silicate gas at a ratio of 1 ppm to 1000 ppm. For example, in the case of using boron as the impurity element imparting p-type conductivity, the concentration of the boron may be controlled to $1\times10^{14}$ atoms/cm$^3$ to $6\times10^{16}$ atoms/cm$^3$. By using the SAS to form a channel region, a field effect mobility of 1 cm$^2$/V·sec to 10 cm$^2$/V·sec can be obtained. The present embodiment can be freely combined with any of the other embodiment modes and embodiments.

Embodiment 4

In this embodiment, structures that are different from the structure of the integrated circuit area shown in Embodiment 1 will be described with reference to FIGS. 15A to 15C.

Figure 15A:
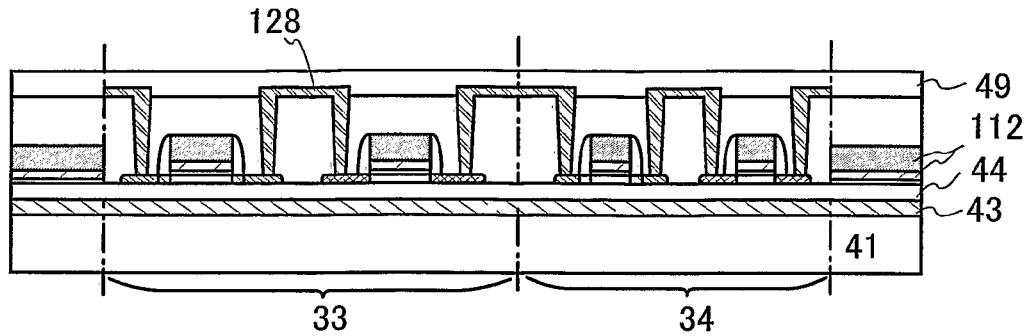
FIGS. 15A to 15C show manufacturing steps of a CPU and a memory according to the invention.

FIG. 15A shows an example in which an antenna 112 and a gate electrode 103 of CPU 33 and a memory 34 are formed in the same layer. In other words, with the use of the material of the gate electrode 103, the antenna 112 can be formed by etching into a desired shape at the same time as the formation of the gate electrode 103, by printing with the use of a conductive paste (specifically Ag, Au, Cu, or Al paste), or by forming a depression in a gate insulating film and pouring an antenna material in the depression.

Figure 15B:
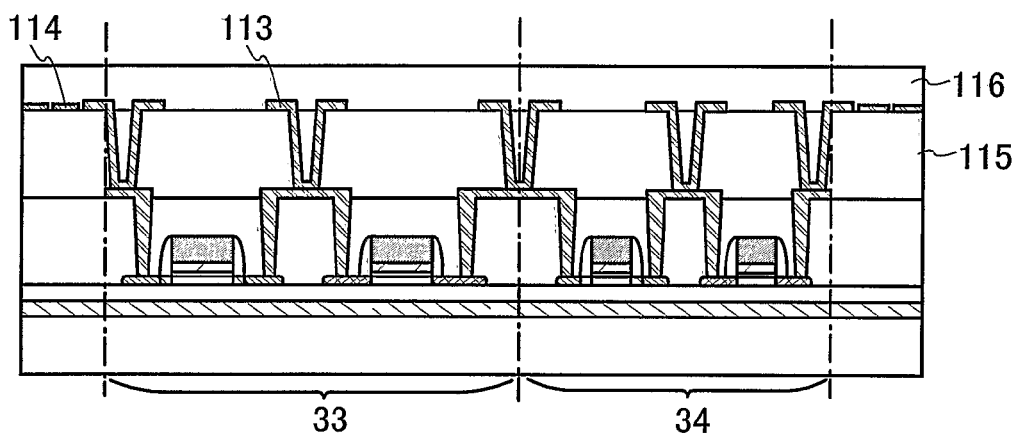

FIG. 15B illustrates an example in which, in the case of forming an antenna 114 and a protective film 116 on an interlayer film 115, the antenna 114 is connected to a TFT through an upper wiring 113. As a material for the upper wiring 113, the conductive materials mentioned in Embodiment 1 can be appropriately employed. By forming the wiring heightwise in this way, an element can be reduced in size.

Figure 15C:
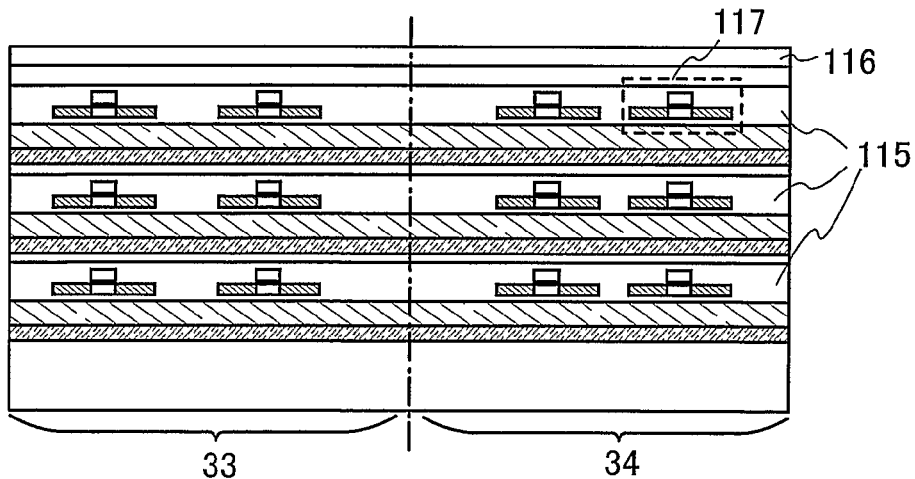

FIG. 15C illustrates a structure in which thin film integrated circuits such as a CPU 33 and a memory 34 are stacked. In this case, it is desirable that an insulating film 115 formed over each thin film transistor 117 is formed to include a highly elastic organic material. For example, photosensitive or non-photosensitive organic materials such as polyimide, acrylic, polyamide, resist and benzocyclobutene and heat-resistant organic resin such as siloxane can be used. As a forming method thereof, a method such as spin coating, dip coating, spraying, or a droplet discharge method (for example, ink-jet printing, screen printing, or offset printing), a doctor knife, a roll coater, a curtain coater, or a knife coater can be employed depending on the material. This concentrates stress on the deformation of the insulating films including the organic material and a protective film, and then these films are mainly deformed. Therefore, stress applied on the thin film transistors is reduced. The present embodiment can be freely combined with any of the other embodiment modes and embodiments.

Embodiment 5

In this embodiment, a method for the management of a commercial product carrying a thin film integrated circuit device (for example, an ID label or an ID tag) according to the present invention and flows of information and commercial products will be described with reference to FIGS. 16 to 18. A case of using ID label device will be described in this embodiment.

Figure 16:
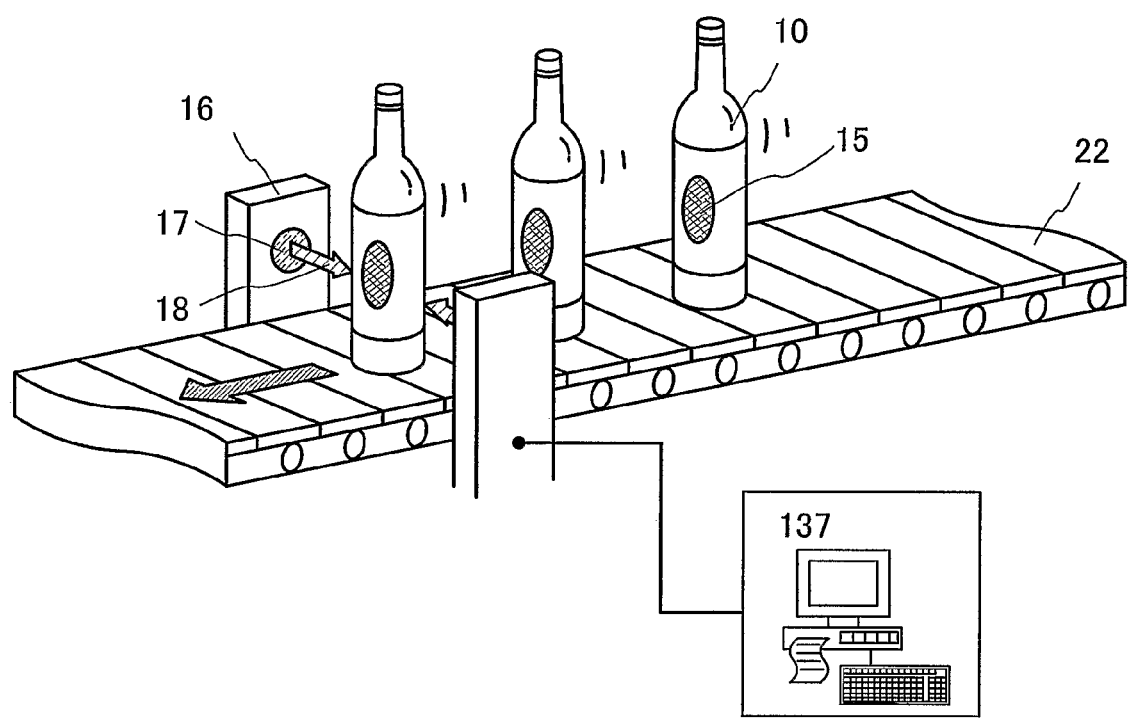
FIG. 16 is a figure showing reading and writing of information of a product including a contactless thin film integrated circuit device according to the invention.

As shown in FIG. 16, information that is necessary for managing commercial products is input into a host computer before shipping products from a manufacturer or before displaying commercial products by a seller. For example, a plurality of commercial products 10 (or boxes, cardboard boxes including the commercial products packed) carrying ID labels 15 are made to go through a reader/writer 16 by using a conveying means 19 such as a belt conveyor, each of the ID labels 15 receives a radio wave 18 emitted from a reader/writer antenna 17, and a radio wave returned from an antenna of each of the ID labels 15 is used to input information on the commercial product into a computer 137. In this case, the reader/writer may be directly connected to the computer.

A great deal of information on the commercial products, which is stored in the ID labels 15, can be input into the computer 137 instantly. Further, the computer has software that has a function of processing the information on the commercial products. Of course, hardware may be used for information processing. Accordingly, as compared with work of reading a bar code one-by-one in the conventional way, time and labor for information processing and errors are reduced to reduce burden for management of the commercial product.

Now, a principle of communication with a noncontact thin film integrated circuit device will be briefly described with reference to FIG. 18. For example, when a commercial product that has a noncontact thin film integrated circuit device 132 is held over a reader/writer 136, an antenna circuit in the noncontact thin film integrated circuit device 132 receives a radio wave transmitted from an antenna circuit 138 of the reader/writer 136 to generate electromotive force due to resonance (such as electromagnetic induction) in a power supply circuit 26. Then, an integrated circuit 25 (IC chip) in the noncontact thin film integrated circuit device 132 is started to convert information in the chip to signals, and then, the signals are transmitted from the antenna circuit on the side of the chip. The signals are received by the antenna circuit 139 of the reader/writer 136, and transmitted through a controller 135 to a host computer 137 for data processing. The host computer may have a means as a reader/writer. The antenna circuit portion of the thin film integrated circuit device 132) has a RF (Radio Frequency) interface 130 and a contactless interface 131, and the antenna circuit portion of the reader/writer 136 has a contactless interface 133 and an interface circuit 134. However, the antenna circuit portions are not limited to these structures.

For a memory 29, for example, a ROM (Read Only Memory), a RAM (Random Access Memory), a PROM, an EPROM or an EEPROM (Electronically Erasable and Programable Read Only Memory), or a FRAM (FeRAM; Ferroelectric Random Access Memory) is used. In the case of using a PROM or an EPROM, writing is not possible except when a card is issued, while rewriting is possible in the case of an EEPROM. These memories may be selected depending on the application.

The power supply circuit 29 may have, for example, a diode and a capacitor, which has a function of converting alternating-current frequency waves to direct-current frequency waves.

It is a feature of a noncontact type that electric power is supplied by electromagnetic induction (electromagnetic induction type), mutual induction (electromagnetic coupling type), or induction due to static electricity (static coupling type) of a coiled antenna. By controlling the number of windings of this antenna, the frequency to be received can be selected.

Although not shown in the figure, an instruction execution unit referred to as a coprocessor, which is used exclusively for code processing, may be connected to a CPU. This enables code processing that is necessary for applications such as settlements.

Figure 17:
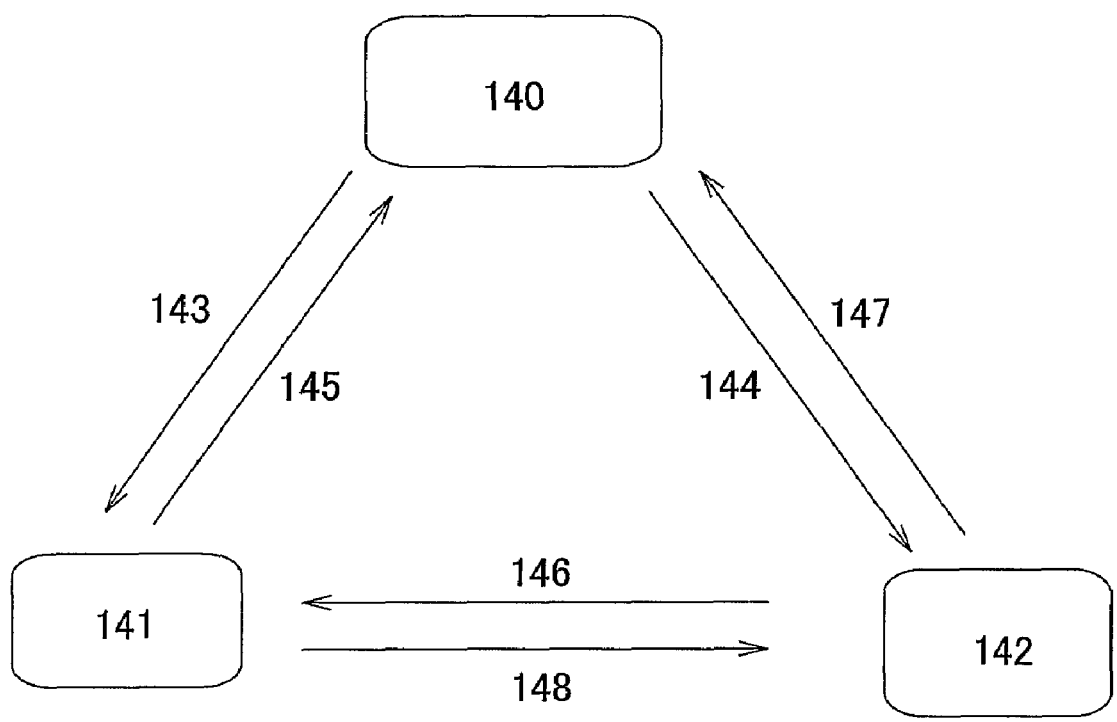
FIG. 17 is a figure showing relations between a producer (a manufacturer), a seller, and a consumer.

In addition, FIG. 17 shows flows of information and commercial products among a producer (manufacturer) 140, a seller 141, and a consumer 142. The producer (manufacturer) 140 provides commercial products 143 and 144 carrying a thin film integrated circuit device to the seller 141 (such as a retailer or a distributor) or the consumer 142. Then, the seller 141 can provide sales information 145 such as price information, the number of sold commercial products, and time of the sales to the producer (manufacturer) 140 on settlement of the consumer 142, for example. On the other hand, the consumer 142 can provide purchase information 146 and 147 such as personal information. For example, by using a credit card carrying a thin film integrated circuit device or a personal reader, or the like, the purchase information can be provided through the Internet to the seller 141 and the producer (manufacturer) 140. Further, the seller 141 can provide commercial product information 148 to the consumer 142 by using the thin film integrated circuit device while the seller 141 can obtain the purchase information from the consumer 142. These sales information and purchase information, or the like is valuable information, and useful for future marketing strategy.

As a means for providing the wide variety of information, there is a method in which information read from the thin film integrated circuit device by a reader of the seller 141 or the consumer 142 is disclosed through a computer or a network to the producer (manufacturer) 140, the seller 141, or the consumer 142. As described above, the wide variety of information can be provided through the thin film integrated circuit device to the party that needs the information, and the thin film integrated circuit device is also useful in commodity exchange and commodity management.

Embodiment 6

In this embodiment, a method of reading information on a commercial product carrying a thin film integrated circuit device (for example, an ID label) according to the present invention will be described with reference to FIGS. 19A to 19C. The case of using an ID label will be described in this embodiment.

Figure 19A:
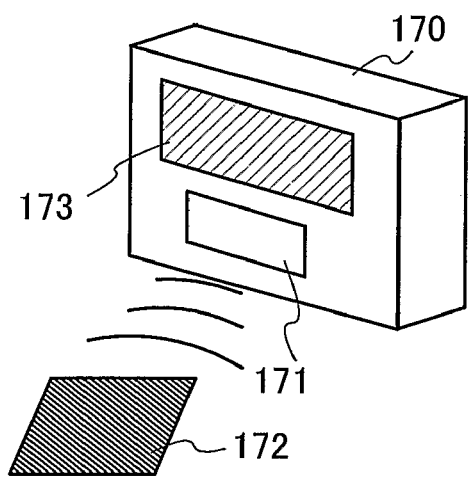
FIGS. 19A to 19C are figures showing examples of readers/writers.

As shown in FIG. 19A, a commercial product 172 carrying an ID label is held over a sensor area 171 of a main body of a reader/writer 170. Then, raw materials of the commercial product, the place of origin thereof, a test result per production (manufacturing) process thereof, and the history of a distribution process thereof, for example, are displayed on a display portion 173, and further, information on the commercial product such as a description of the commercial product is displayed. Of course, it is not always necessary that the reader/writer have the display portion, which may be provided separately. This reader/writer may be placed at a shelf where the commercial product is displayed.

Figure 19B:
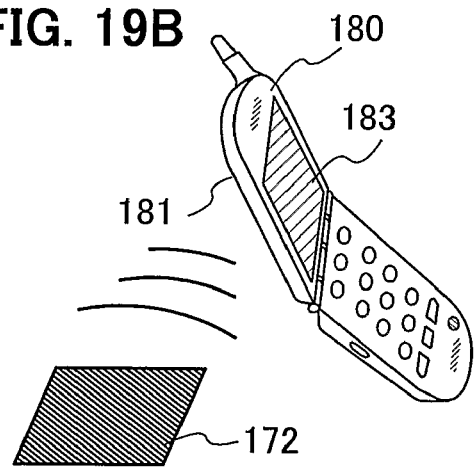

As shown in FIG. 19B, a personal potable information terminal, for example, a main body of a cellular phone 180 is mounted with a function as a reader/writer, and a commercial product 172 carrying an ID label is held over a sensor area 181 provided in a portion of the main body to display information on a display portion 183. Then, information on the commercial product is displayed in the same way.

Figure 19C:
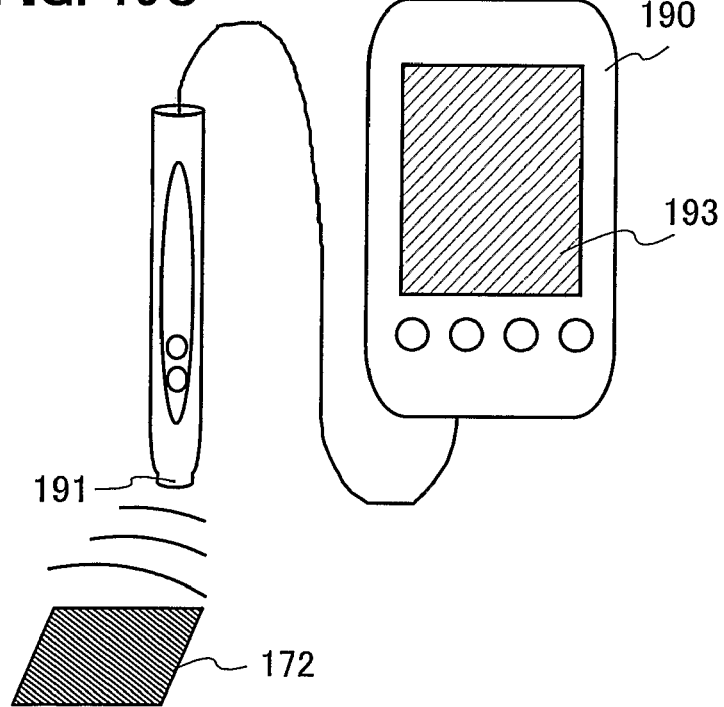

As shown in FIG. 19C, a commercial product 172 carrying an ID label is held over a sensor area 191 connected to a main body of a reader 190 which is portable, information is provided on a display portion 193. Then, information on the commercial product is displayed in the same way.

Although the contactless reader/writer is described in this embodiment, information may be displayed on a display portion also in the case of a contact type. A display portion may be provided in a commercial product itself carrying a noncontact type or contact type thin film integrated circuit device to display information.

In this way, as compared with information provided from a conventional radio frequency tag or the like, a consumer can obtain a lot of information on a commercial product freely. Of course, commercial products can be managed quickly and accurately by using a thin film integrated circuit device.

The noncontact thin film integrated circuit device according to the present invention may be 2 m or less away from the card reader/writer (reader/writer?) (remote type), 70 cm or less away (adjacent type), 10 cm or less away (close type), or several centimeters away (very close type). In consideration of work of a production field or manufacturing floor, the close type or the very close type is preferable.

The frequency to be generally used is 2.45 GHz (microwave) in the remote type, 13.56 MHz in the adjacent type and the close type, or 4.91 MHz or 125 kHz in the very close type. By increasing the frequency to make the wavelength shorter, the number of windings of an antenna can be reduced.

As compared with a contact type thin film integrated circuit device, the noncontact thin film integrated circuit device is not made to come in contact with the reader/writer, and supply of power source and communication of information are conducted without contact. Therefore, the noncontact thin film integrated circuit device is not destroyed to have higher ruggedness, it is unnecessary to worry about errors due to a cause such as static electricity. Further, it is easy to handle the thin film integrated circuit device, which may merely be held over the reader/writer with an uncomplicated structure.

Embodiment 11

In this embodiment, examples of commercial product carrying a thin film integrated circuit device or a noncontact thin film integrated circuit device (for example, a radio chip or an ID label) according to the present invention will be described with reference to FIGS. 20A to 20D and FIGS. 21A to 21D.

Figure 20A:
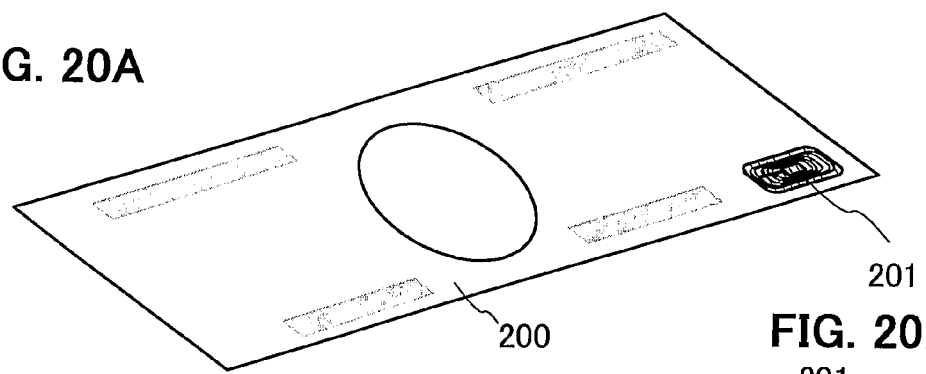
FIGS. 20A to 20D are figures showing examples of products each including a thin film integrated circuit device according to the invention.
Figure 20B:
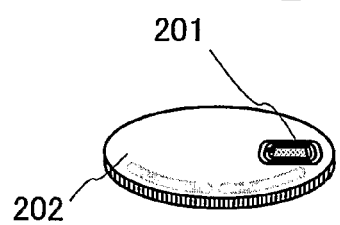
Figure 20C:
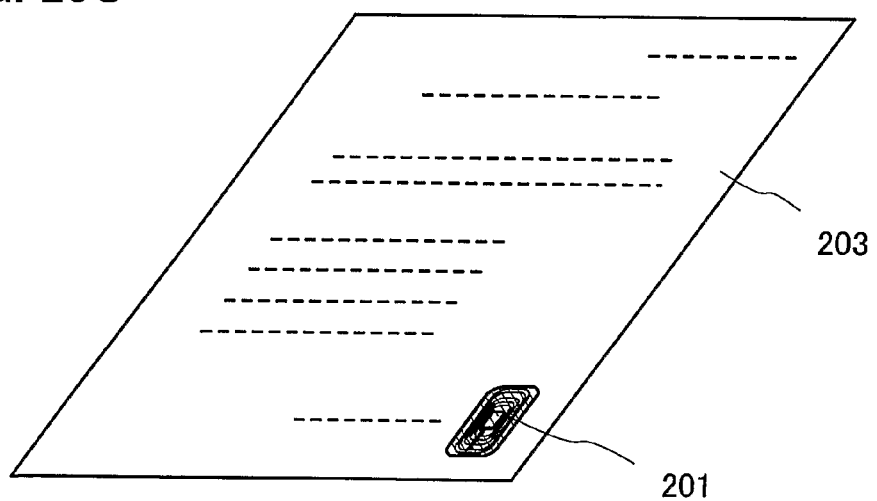
Figure 20D:
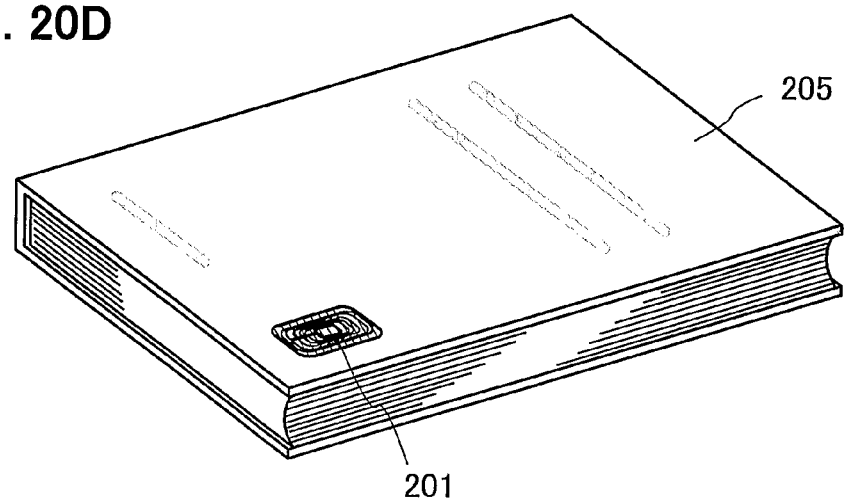

FIG. 20A shows a banknote 200 (may be securities, a ticket, a T/C (traveler's check) or the like, alternatively) and a coin 202 (may be a medal, or the like alternatively), which have a thin film integrated circuit device 201 incorporated therein. FIG. 20B shows a coin 202 incorporated with the thin film integrated circuit device 201, which may be a medal alternatively. FIG. 20C shows a document 203 such as a resistance certificate or a family register, which is incorporated with the thin film integrated circuit device 201. FIG. 20D shows a book 205, which has a thin film integrated circuit device 201 incorporated in a book jacket thereof.

The noncontact type or contact type thin film integrated circuit device according to the present invention is quite thin. Therefore, even when the thin film integrated circuit device is incorporated into goods such as the banknote, coin, document, or book described above, the function or design is not impaired. Further, in the case of the noncontact thin film integrated circuit device, an antenna can be integrated with an IC, and thus, it becomes easier to transfer the thin film integrated circuit device to a commercial product with a curved surface.

Figure 21A:
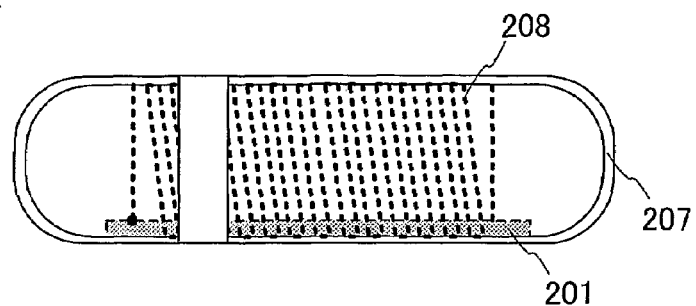
FIGS. 21A to 21D are figures showing examples of products each including a thin film integrated circuit device according to the invention.

FIG. 21A shows a capsule 207, which has a thin film integrated circuit device 201 incorporated therein. Inside the capsule 207, a coiled antenna 208 is formed, with which the thin film integrated circuit device 201 can communicate with an external reader/writer. For example, by making a human being or an animal to take capsule 207, information such as health condition of the human being or the animal can be obtained instantly.

Figure 21B:
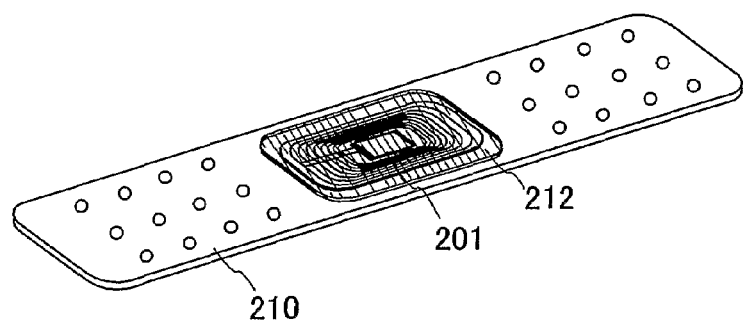

FIG. 21B shows a plaster 210, which has a thin film integrated circuit device 201 incorporated therein. It makes the use as a common plaster possible to provide the thin film integrated circuit device 201 on the backside of a cover 212 (as a gauze). In this way, the present invention can be applied to various medical instruments.

Figure 21C:
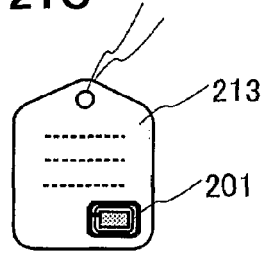

FIG. 21C shows an ID tag 213, which has a thin film integrated circuit device 201 incorporated. By mounting the ID tag 213 on commercial products, the management of the commercial products becomes easier. For example, in the case where the commercial product is stolen, the criminal can be figured out quickly by tracing the pathway of the commercial product. In this way, by providing the ID tag, commercial products that are superior in so-called traceability (in the case where a problem is caused at each step of complicated manufacturing or distribution, making an arrangement to figure out the cause quickly by tracing the pathway) can be distributed.

Figure 21D:
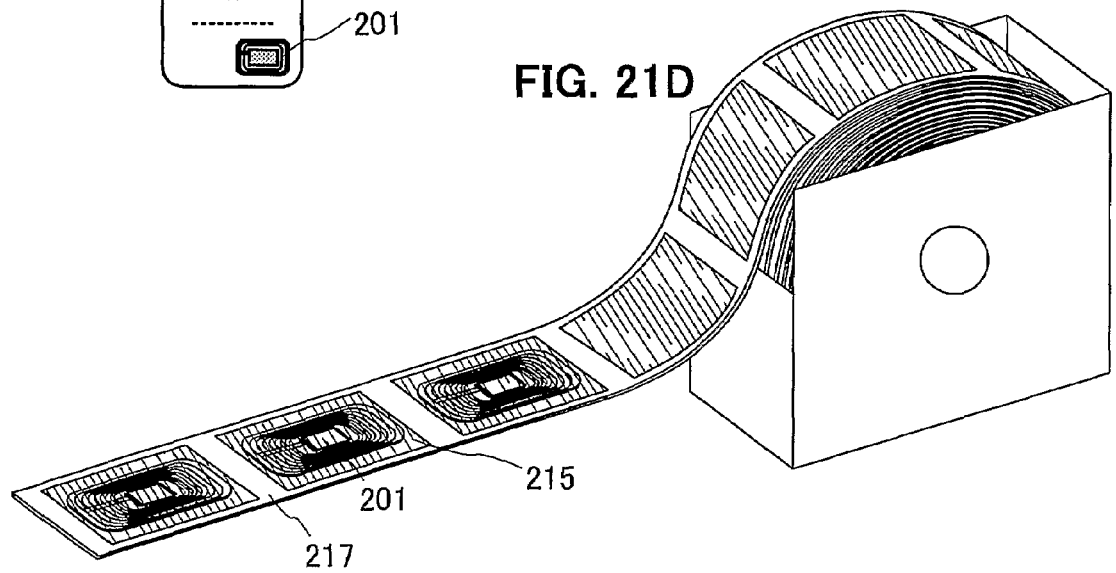

FIG. 21D shows an ID label 215, which has thin film integrated circuit device 201 mounted on a label board 217 and incorporated therein. On the ID label, information on a commercial product or service (for example, an name of article, a brand, a trademark, a trademark owner, a seller, and a manufacturer) is written, while an ID number that is unique to the commercial product (or the kind of the commercial product) is assigned to the incorporated thin film integrated circuit device to make it possible to easily figure out forgery, infringement of intellectual property rights such as a patent and a trademark, and illegality such as unfair competition. In addition, a lot of information that is too much to write clearly on a container of the commercial product or the label, for example, the production area, selling area, quality, raw material, efficacy, use, quantity, shape, price, production method, directions for use, time of the production, time of the use, expiration date, and instructions of the commercial product, and information on the intellectual property of the commercial product, can be input in the thin film integrated circuit device so that a transactor and a consumer can access the information by using a simple reader. While the producer can also easily rewrite or delete the information, or the like, a transactor or consumer is not allowed to rewrite or delete the information, either.

Although not shown in the figure, it is also possible to manufacture a thin film integrated circuit device by using a metal, an organic material, or the like that is not harmful for a human body or an animal and mix the thin film integrated circuit device in food to control diet, for example.

In addition to the commercial products described above, the thin film integrated circuit or noncontact thin film integrated circuit device can be used for all kinds of commercial products.

In the above embodiments and embodiment modes, a noncontact thin film integrated circuit device has been mainly described; however, a thin film integrated circuit according to the invention can be naturally applied to a contact thin film integrated circuit device such as a magnetic stripe or a contact IC module chip. In the case of a contact IC, a structure without an antenna may be used. Further, such as a magnetic stripe or an contact IC module chip may be combined with a noncontact thin film integrated circuit device.

A method for manufacturing a thin film integrated circuit, a noncontact thin film integrated circuit and a method manufacturing the same according to the invention can significantly reduce manufacturing costs compared with a method for manufacturing an IC chip which is formed on a conventional silicon wafer. According to the present invention, a thin film integrated circuit used for a thin film integrated circuit device, and further a noncontact thin film integrated circuit device and commercial products using the thin film integrated circuit device can be mass-produced at low cost with higher yield and throughput. Further, a method for manufacturing a thin film integrated circuit according to the invention can be applied to a contact or noncontact thin film integrated circuit device; thus, wide range of application can be provided.

The invention claimed is:

1. A method for manufacturing a thin film integrated circuit device comprising the steps of:
   forming a peel-off layer over a substrate;
   forming a base film over the peel-off layer;
   forming a plurality of thin film integrated circuit devices over the base film;
   forming a groove at a boundary between the plurality of thin film integrated circuit devices; and introducing a gas or a liquid containing halogen fluoride into the groove, thereby removing the peel-off layer, thereby separating the plurality of thin film integrated circuit devices, wherein the substrate is a glass substrate or a quartz substrate.

2. A method for manufacturing a thin film integrated circuit device comprising the steps of:

forming a peel-off layer over a substrate;

forming a base film over the peel-off layer;

forming a plurality of thin film integrated circuit devices over the base film;

forming a groove at a boundary between the plurality of thin film integrated circuit devices;

attaching a jig to an upper portion of the plurality of thin film integrated circuit devices;

introducing a gas or a liquid containing halogen fluoride into the groove, thereby removing the peel-off layer, thereby separating the plurality of thin film integrated circuit devices; and removing the jig attached to the plurality of thin film integrated circuit devices, wherein the substrate is a glass substrate or a quartz substrate.

3. A method for manufacturing a thin film integrated circuit device comprising the steps of:

forming a peel-off layer over a substrate;

forming a base film over the peel-off layer;

forming a plurality of thin film integrated circuits over the base film;

forming an insulating film over the plurality of thin film integrated circuits, thereby forming a plurality of thin film integrated circuit devices;

forming a groove at a boundary between the plurality of thin film integrated circuit devices; and introducing a gas or a liquid containing halogen fluoride into the groove, thereby removing the peel-off layer, thereby separating the plurality of thin film integrated circuit devices, wherein the substrate is a glass substrate or a quartz substrate.

4. A method for manufacturing a thin film integrated circuit device comprising the steps of:

forming a peel-off layer over a substrate;

forming a base film over the peel-off layer;

forming a plurality of thin film integrated circuits over the base film;

forming an insulating film over the plurality of thin film integrated circuits, thereby forming a plurality of thin film integrated circuit devices;

forming a groove at a boundary between the plurality of thin film integrated circuit devices;

attaching a jig to an upper portion of the plurality of thin film integrated circuit devices;

introducing a gas or a liquid containing halogen fluoride into the groove, thereby removing the peel-off layer, thereby separating the plurality of thin film integrated circuit devices; and removing the jig attached to the plurality of thin film integrated circuit devices, wherein the substrate is a glass substrate or a quartz substrate.

5. A method for manufacturing a thin film integrated circuit device according to claim 2 or claim 4, wherein the jig is attached using an adhesive material whose adhesive force is reduced or lost by UV light irradiation.

6. A method for manufacturing a thin film integrated circuit device according to claim 3 or claim 4, wherein the insulating film contains a material that has a skeletal structure including a bond of silicon and oxygen and includes at least hydrogen as a substituent or at least one selected from the group consisting of fluorine, an alkyl group, and an aromatic hydrocarbon as the substituent.

7. A method for manufacturing a thin film integrated circuit device according to any one of claims 1 through 4, wherein the peel-off layer contains silicon as a main component.

8. A method for manufacturing a thin film integrated circuit device according to any one of claims 1 through 4, wherein the base film contains one selected from silicon oxide, silicon nitride, and silicon oxide containing nitrogen.

9. A method for manufacturing a thin film integrated circuit device according to any one of claims 1 through 4, wherein the groove is formed by dicing or dry etching.

10. A method for manufacturing a thin film integrated circuit device according to any one of claims 1 through 4, wherein the halogen fluoride is $ClF_3$ (chlorine trifluoride).

11. A method for manufacturing a noncontact thin film integrated circuit device comprising the steps of:

forming a peel-off layer over a substrate;

forming a base film over the peel-off layer;

forming a plurality of thin film integrated circuits over the base film;

forming an insulating film over the plurality of thin film integrated circuits, thereby forming a plurality of thin film integrated circuit devices;

forming a groove at a boundary between the plurality of thin film integrated circuit devices;

introducing a gas or a liquid containing halogen fluoride into the groove, thereby removing the peel-off layer, thereby separating the plurality of thin film integrated circuit devices; and forming an antenna on an upper or lower portion of the plurality of thin film integrated circuit devices, wherein the substrate is a glass substrate or a quartz substrate.

12. A method for manufacturing a noncontact thin film integrated circuit device comprising the steps of:

forming a peel-off layer over a substrate;

forming a base film over the peel-off layer;

forming a plurality of thin film integrated circuits over the base film;

forming an insulating film over the plurality of thin film integrated circuits, thereby forming a plurality of thin film integrated circuit devices;

forming a groove at a boundary between the plurality of thin film integrated circuit devices;

attaching a jig to an upper portion of the plurality of thin film integrated circuit devices;

introducing a gas or a liquid containing halogen fluoride into the groove, thereby removing the peel-off layer, thereby separating the plurality of thin film integrated circuit devices;

removing the jig attached to the plurality of thin film integrated circuit devices; and forming an antenna on an upper or lower portion of the plurality of thin film integrated circuit devices, wherein the substrate is a glass substrate or a quartz substrate.

13. A method for manufacturing a noncontact thin film integrated circuit device comprising the steps of:

forming a peel-off layer over a first substrate;

forming a base film over the peel-off layer;

forming a plurality of thin film integrated circuit devices over the base film;

forming a groove at a boundary between the plurality of thin film integrated circuit devices;

introducing a gas or a liquid containing halogen fluoride into the groove, thereby removing the peel-off layer, thereby separating the plurality of thin film integrated circuit devices; and enfolding at least one of the thin film integrated circuit devices with a substrate provided with an antenna, wherein the first substrate is a glass substrate or a quartz substrate.

14. A method for manufacturing a noncontact thin film integrated circuit device comprising the steps of:

forming a peel-off layer over a first substrate;

forming a base film over the peel-off layer;

forming a plurality of thin film integrated circuit devices over the base film;

forming a groove at a boundary between the plurality of thin film integrated circuit devices;

attaching a jig to an upper portion of the plurality of thin film integrated circuit devices;

introducing a gas or a liquid containing halogen fluoride into the groove, thereby removing the peel-off layer, thereby separating the plurality of thin film integrated circuit devices;

removing the jig attached to the plurality of thin film integrated circuit devices; and enfolding at least one of the thin film integrated circuit devices with a substrate provided with an antenna, wherein the first substrate is a glass substrate or a quartz substrate.

15. A method for manufacturing a noncontact thin film integrated circuit device according to claim 12 or claim 14, wherein the jig is attached using an adhesive material whose adhesive force is reduced or lost by UV light irradiation.

16. A method for manufacturing a noncontact thin film integrated circuit device according to claim 11 or claim 12, wherein the insulating film contains a material that has a skeletal structure including a bond of silicon and oxygen and includes at least hydrogen as a substituent or at least one selected from the group consisting of fluorine, an alkyl group, and an aromatic hydrocarbon as the substituent.

17. A method for manufacturing a noncontact thin film integrated circuit device according to any one of claims 11 through 14, wherein the peel-off layer contains silicon as a main component.

18. A method for manufacturing a noncontact thin film integrated circuit device according to any one of claims 11 through 14, wherein the base film contains one selected from silicon oxide, silicon nitride, and silicon oxide containing nitrogen.

19. A method for manufacturing a noncontact thin film integrated circuit device according to any one of claims 11 through 14, wherein the groove is formed by dicing or dry etching.

20. A method for manufacturing a noncontact thin film integrated circuit device according to any one of claims 11 through 14, wherein the halogen fluoride is $ClF_3$ (chlorine trifluoride).

* * * * *